United States Patent
Lillibridge et al.

(10) Patent No.: US 11,119,137 B2
(45) Date of Patent: Sep. 14, 2021

(54) ELECTRICAL TEST STRUCTURE AND METHOD FOR MONITORING DEEP TRENCH IMPEDANCE TO SUBSTRATE

(71) Applicant: Texas Instruments Incorporated, Dallas, TX (US)

(72) Inventors: Thomas Edward Lillibridge, Plano, TX (US); Neil L Gardner, Lowry Crossing, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 53 days.

(21) Appl. No.: 16/737,575

(22) Filed: Jan. 8, 2020

(65) Prior Publication Data
US 2021/0208187 A1    Jul. 8, 2021

(51) Int. Cl.
| | | |
|---|---|---|
| *H01L 23/64* | (2006.01) | |
| *G01R 27/16* | (2006.01) | |
| *B81B 7/00* | (2006.01) | |
| *H01L 21/768* | (2006.01) | |
| *B81C 99/00* | (2010.01) | |
| *B81C 1/00* | (2006.01) | |
| *H01L 21/66* | (2006.01) | |

(52) U.S. Cl.
CPC ............ *G01R 27/16* (2013.01); *B81B 7/0006* (2013.01); *B81C 1/00095* (2013.01); *B81C 99/0035* (2013.01); *H01L 21/76877* (2013.01); *H01L 22/32* (2013.01); *H01L 23/64* (2013.01)

(58) Field of Classification Search
None
See application file for complete search history.

(56) References Cited

U.S. PATENT DOCUMENTS

| | | | | |
|---|---|---|---|---|
| 2012/0187544 A1* | 7/2012 | Yamashita | .............. | H01L 22/32 257/620 |
| 2017/0162458 A1* | 6/2017 | Onozawa | ................ | H01L 22/20 |
| 2017/0200661 A1* | 7/2017 | Lee | .......................... | H01L 22/32 |
| 2020/0287029 A1* | 9/2020 | Ishikawa | ........... | H01L 29/66348 |

\* cited by examiner

*Primary Examiner* — Benjamin P Sandvik
(74) *Attorney, Agent, or Firm* — Jacqueline J. Garner; Charles A. Brill; Frank D. Cimino

(57) ABSTRACT

A microelectronic device includes a deep trench test structure in semiconductor material of a substrate. The deep trench test structure has pad trench segments with a liner of electrically non-conductive material and a trench fill material on the liner, extending to tops of the pad trench segments. The pad trench segments extend across a probe pad region; at least 20 microns in every lateral direction. The trench fill material at the top of the pad trench segments occupies at least 25 percent of the probe pad region. The liner may electrically isolate the trench fill material from the semiconductor material, or the deep trench test structure may include a contact trench segment wherein the trench fill material contacts the semiconductor material. The deep trench test structure may be probed on the pad trench segments to measure an impedance between the trench fill material and the semiconductor material.

20 Claims, 28 Drawing Sheets ical test structure and method for monitoring deep trench impedance to substrate

FIELD

This disclosure relates to the field of integrated circuits. More particularly, but not exclusively, this disclosure relates to test structures to detect electrical impedance of deep trench isolation features to substrate in integrated circuits.

BACKGROUND

Polycrystalline silicon, commonly referred to as polysilicon, is commonly used in semiconductors to fill deep trench isolation features. In some cases, the polysilicon is intended to make contact to silicon substrates, in other cases it is intended to be electrically isolated from the substrate. Unfortunately, variation in photolithographic critical dimensions, silicon etching characteristics and unintended contamination can result in contacts with unintended resistance or leakage to substrate characteristics. Traditional methods to detect resistance or leakage between deep trench isolation polysilicon and substrate have typically been performed on a completed device, that is after completing all front-end-of-line (FEOL) and some or all back-end-of-line (BEOL) processing as part of quality assurance monitoring. Examples of conventional detection methods include assessing the electrical or logic performance characteristics of the device by, for example, measuring leakage current or bit failure rates, or by measuring contact and via resistances.

SUMMARY

The present disclosure introduces a microelectronic device having a substrate which includes a semiconductor material, and a deep trench test structure in the substrate. The deep trench test structure has a continuous deep trench which includes pad trench segments in the substrate. Each pad trench segment includes a liner of electrically non-conductive material on sidewalls of the continuous deep trench. Each pad trench segment further includes a trench fill material on the liner, extending to a top of the pad trench segment. The trench fill material is electrically conductive. The pad trench segments extend across a probe pad region; the probe pad region extends at least 20 microns in every lateral direction. The trench fill material at the tops of the pad trench segments occupies at least 25 percent of the probe pad region.

In one aspect, the liner may extend across bottoms of the pad trench segments, so that the liner electrically isolates the trench fill material from the semiconductor material contacting the pad trench segment.

In another aspect, the deep trench test structure may include a contact trench segment that is continuous with the pad trench segments. The contact trench segment includes the liner on sidewalls of the contact trench segment and the trench fill material on the liner. In the contact trench segment, the liner is open at a bottom of the contact trench segment, and the trench fill material extends through the liner to the semiconductor material of the substrate at the bottom of the contact trench segment.

The microelectronic device may be formed by providing the substrate having the semiconductor material, and forming an etch mask over the substrate, so that the etch mask exposes a continuous area for the continuous deep trench of the deep trench test structure. The semiconductor material is removed from the substrate where exposed by the etch mask to form the continuous deep trench in the substrate. The continuous deep trench includes the pad trench segments. The liner is formed in the continuous deep trench. The trench fill material is formed on the liner in the continuous deep trench, extending to tops of the pad trench segments, wherein the trench fill material occupies at least 25 percent of the probe pad region.

In one aspect, an electrical measurement of the electrical impedance between the trench fill material and the semiconductor material in the substrate may be made by contacting the trench fill material at the top of the pad trench segments in the probe pad region.

DETAILED DESCRIPTION

Figure 1A:
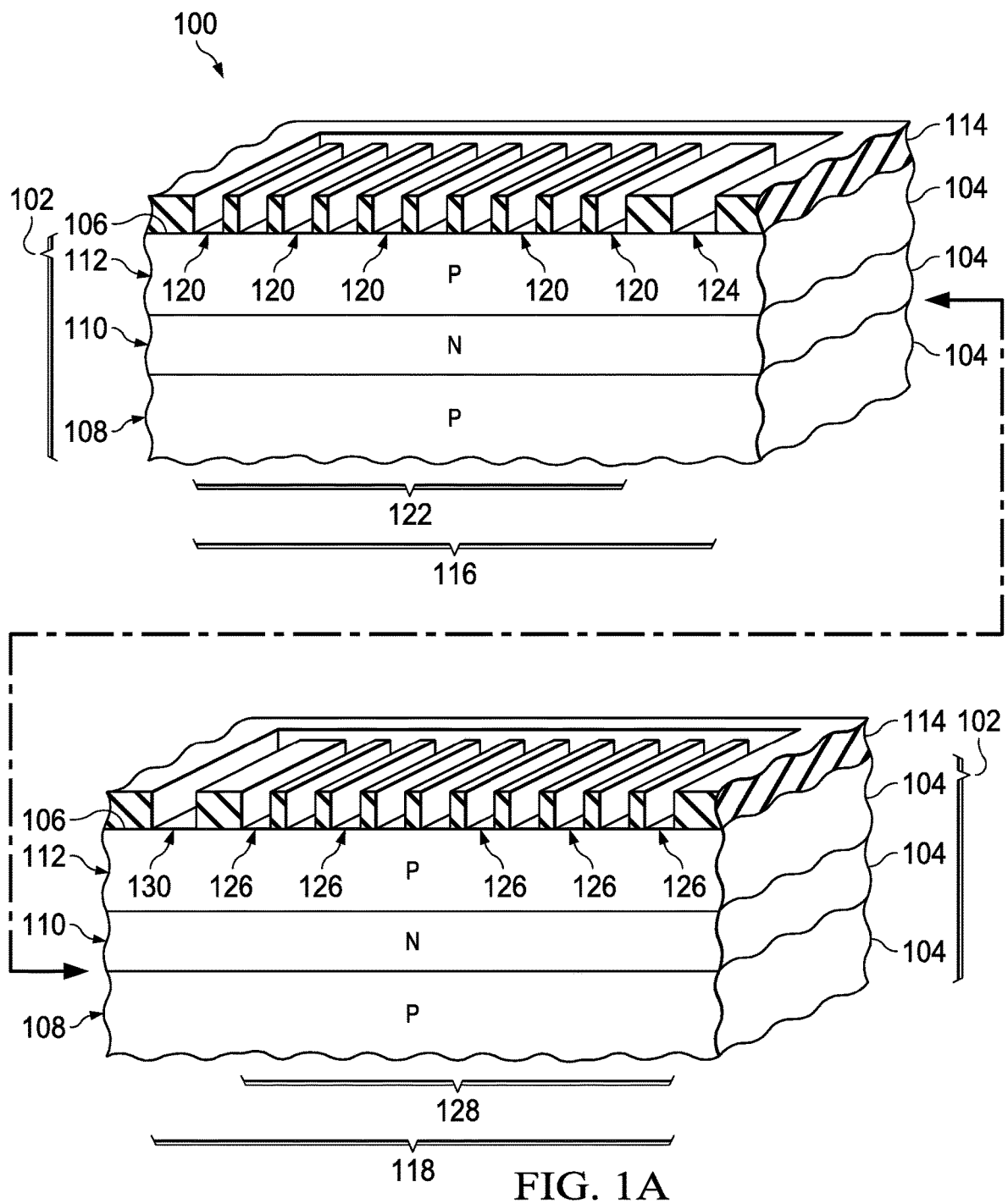
FIG. 1A through FIG. 1H are cross sections of an example microelectronic device, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a substrate, which includes a semiconductor material. The substrate has a top surface, and the semiconductor material extends to the top surface of the substrate. The substrate has a deep trench test structure with a continuous deep trench contacting the semiconductor material. The continuous deep trench includes pad trench segments extending into the substrate. The pad trench segments extend across a probe pad region which extends at least 20 microns in every lateral direction. For the purposes of this disclosure, the terms "lateral" and "laterally" refer to directions parallel to the top surface of the substrate. Each pad trench segment includes a liner of electrically non-conductive material on sidewalls of the continuous deep trench. The liner may be manifested as one or more sublayers of dielectric material, such as silicon dioxide, silicon oxynitride, or silicon nitride. Each pad trench segment further includes a trench fill material on the liner, extending to a top of the pad trench segment. The trench fill material is electrically conductive. The trench fill material may be manifested as polycrystalline silicon, referred to herein as polysilicon, or tungsten, by way of example. The top of each pad trench segment is located proximate to, and parallel to, the top surface of the substrate. The trench fill material at the tops of the pad trench segments occupies at least 25 percent of the probe pad region. The deep trench test structure enables a measurement of an electrical impedance between the trench fill material and the semiconductor material of the substrate, after the deep trench test structure is formed, before additional steps in the fabrication of the microelectronic device are performed. Measuring the electrical impedance may provide an assessment of the electrical impedance, which may enable an estimate of the performance of the microelectronic device. Measuring the electrical impedance before the additional fabrication steps are performed may advantageously enable a decision on whether or not to proceed with fabrication or to discard the substrate, saving the cost of the additional fabrication steps. Thus, an operational cost of the fabrication facility producing the microelectronic device may be reduced, advantageously resulting in a reduced average cost of devices produced by the fabrication facility. The deep trench test structure may be located in a circuit region of the microelectronic device, or may be located in a singulation lane between the circuit region of the microelectronic device and another circuit region of an adjacent microelectronic device on the same substrate.

FIG. 1A through FIG. 1H are cross sections of an example microelectronic device, depicted in stages of an example method of formation. Referring to FIG. 1A, the microelectronic device 100 is formed in and on a substrate 102. The substrate 102 includes a semiconductor material 104 such as silicon, silicon germanium, silicon carbide, gallium nitride, or gallium arsenide. The substrate 102 may be implemented as a semiconductor wafer, a microelectrical mechanical system (MEMS) substrate, or a dielectric substrate with a semiconductor layer, by way of example. The semiconductor material 104 extends to a top surface 106 of the substrate 102. The microelectronic device 100 may be implemented as an integrated circuit, a discrete semiconductor device, a MEMS device, an optoelectronic device, a microfluidics device, or a micro-optical-mechanical system (MOMS) device, by way of example. In this example, the semiconductor material 104 may include a base layer 108, a buried layer 110 on the base layer 108, and a top layer 112 extending to the top surface 106. The top layer 112 may have a first conductivity type, for example, p-type, as indicated in FIG. 1A, and may have a thickness of 3 microns to 10 microns, by way of example. The buried layer 110 may have a second conductivity type opposite from the first conductivity type, for example, n-type, as indicated in FIG. 1A, and may have a thickness of 1 micron to 5 microns, by way of example. The base layer 108 may have the first conductivity type, as indicated in FIG. 1A.

An etch mask 114 is formed over the top surface 106 of the substrate 102. The etch mask 114 exposes the substrate 102 in an area that is continuous for a first deep trench test structure 116 and a second deep trench test structure 118. The etch mask 114 may include one or more hard mask materials, such as silicon dioxide, silicon nitride, or silicon oxynitride. The etch mask 114 may be formed by forming one or more sublayers of the hard mask materials over the top surface 106, and forming a photoresist mask over the hard mask materials using a photolithographic process. The one or more sublayers of the hard mask materials are etched, where exposed by the photoresist mask, to form the etch mask 114. The photoresist mask may be removed.

In this example, the etch mask 114 may expose the substrate 102 in areas for first pad trench segments 120 of the first deep trench test structure 116 which extend across a first probe pad region 122. The first probe pad region 122 extends at least 20 microns in every lateral direction. In this example, the etch mask 114 may further expose the substrate 102 in an area for a first contact trench segment 124 of the first deep trench test structure 116, outside of the first probe pad region 122. The areas for the first pad trench segments 120 and the area for the first contact trench segment 124 may be continuous in the area exposed by the etch mask 114, as depicted in FIG. 1A. The area for the first contact trench segment 124 may be wider than each area for the first pad trench segments 120. For example, the area for the first contact trench segment 124 may have a width of 2 microns to 3 microns, and each area for the first pad trench segments 120 may have a width of 1 micron to 2 microns.

In this example, the etch mask 114 may also expose the substrate 102 in areas for second pad trench segments 126 of the second deep trench test structure 118 which extend across a second probe pad region 128. The second probe pad region 128 extends at least 20 microns in every lateral direction. In this example, the etch mask 114 may further expose the substrate 102 in an area for a second contact trench segment 130 of the second deep trench test structure 118, outside of the second probe pad region 128. The areas for the second pad trench segments 126 and the area for the second contact trench segment 130 may be continuous in the area exposed by the etch mask 114, as depicted in FIG. 1A. The area for the second contact trench segment 130 may have a width that is equal to the width of the area for the first contact trench segment 124. Similarly, each area for the second pad trench segments 126 may have a width that is equal to the width of each area for the first pad trench segments 120. For the purposes of this disclosure, when two quantities, physical parameters, structures, or elements are disclosed as being equal, the term "equal" may be understood as equal within fabrication tolerances used to design and fabricate the microelectronic device. The term "equal" may also be understood as equal within measurement tolerances that are normally encountered when measuring the quantities, physical parameters, structures, and elements. In the absence of information regarding fabrication tolerances or measurement tolerances, the term "equal" may also be understood as equal within 10 percent, that is, a difference between the quantities, physical parameters, structures, or elements divided by an average of the quantities, physical parameters, structures, or elements, is less than 10 percent.

Figure 1B:
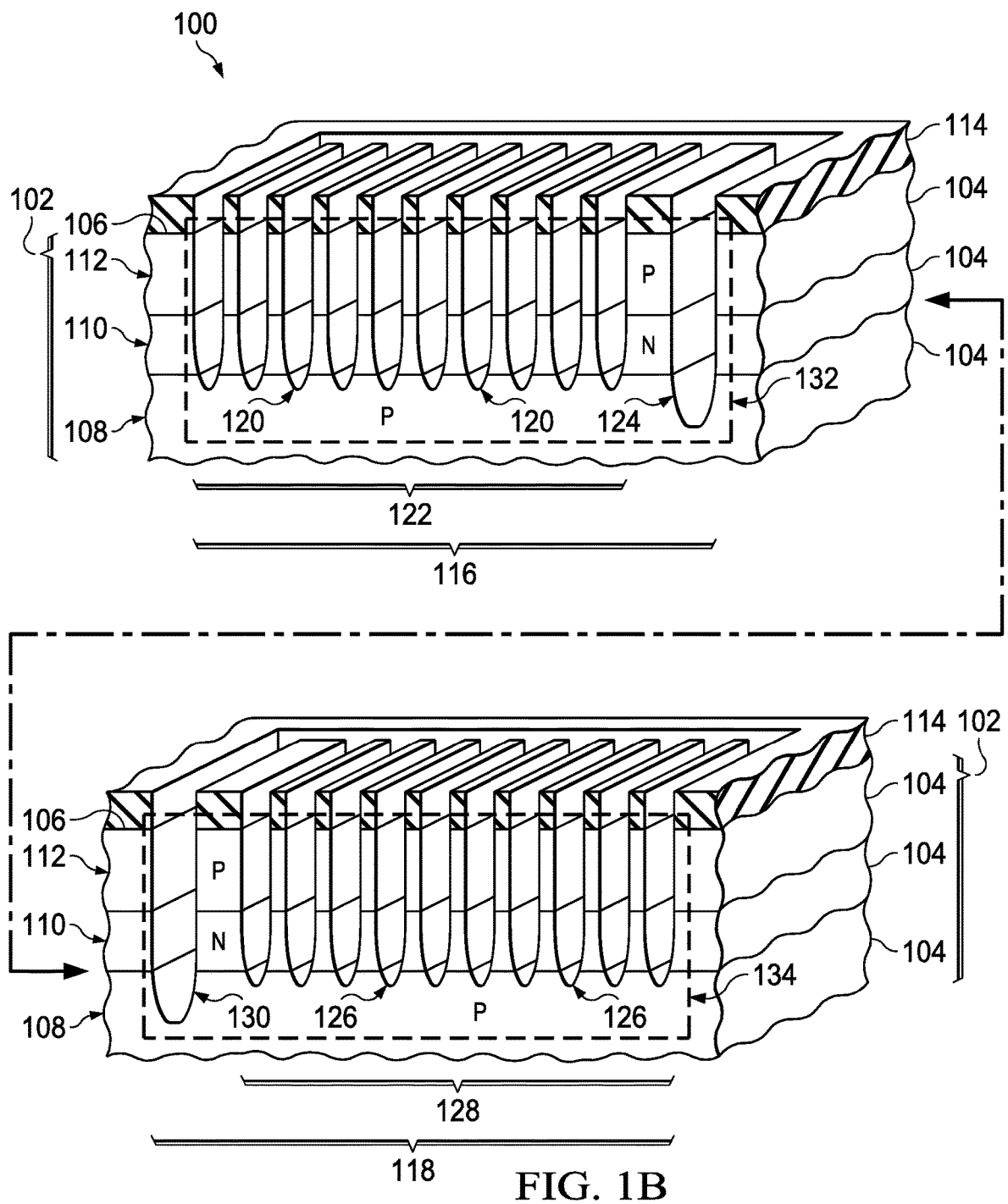

Referring to FIG. 1B, the semiconductor material 104 is removed from the substrate 102 where exposed by the etch mask 114 to form a first continuous deep trench 132 in the substrate 102, and to form a second continuous deep trench 134 in the substrate 102. The first continuous deep trench 132 is part of the first deep trench test structure 116, and the second continuous deep trench 134 is part of the second deep trench test structure 118. In versions of this example in which the semiconductor material 104 includes primarily silicon, the semiconductor material 104 may be removed by a two-step reactive ion etch (RIE) process using sulfur hexafluoride ($SF_6$) and octaflurocyclobutane ($C_4F_8$), sometimes referred to as the Bosch process. Alternatively, the semiconductor material 104 may be removed by a continuous RIE process using $C_4F_8$ and oxygen ($O_2$) which simultaneously etches the semiconductor material 104 at bottoms of the first continuous deep trench 132 and the second continuous deep trench 134 while forming a polymer protective layer on sidewalls (not shown) of the first continuous deep trench 132 and the second continuous deep trench 134, to obtain desired etch profiles. Other etch processes for removing the semiconductor material 104 where exposed by the etch mask 114 are within the scope of this example. The first pad trench segments 120 and the first contact trench segment 124 are connected by being parts of the first continuous deep trench 132. Similarly, the second pad trench segments 126 and the second contact trench segment 130 are connected by being parts of the second continuous deep trench 134.

The pad trench segments 120 and 126 may extend through the buried layer 110, as depicted in FIG. 1B. Alternatively, the pad trench segments 120 and 126 may extend into, but not through, the buried layer 110. In this example, the contact trench segments 124 and 130 extend through the buried layer 110 and into the base layer 108. Each of the contact trench segments 124 and 130 are wider than each of the pad trench segments 120 and 126, as depicted in FIG. 1B, as a result of the etch mask 114 exposing wider areas of the substrate 102 for the contact trench segments 124 and 130 than the pad trench segments 120 and 126. The contact trench segments 124 and 130 may be deeper in the substrate 102 than the pad trench segments 120 and 126, as depicted in FIG. 1B, because the etch process used to remove the semiconductor material 104 may be more effective at removing the semiconductor material 104 in wider etch areas. The etch mask 114 may be left in place for subsequent fabrication steps, or may be removed.

Figure 1C:
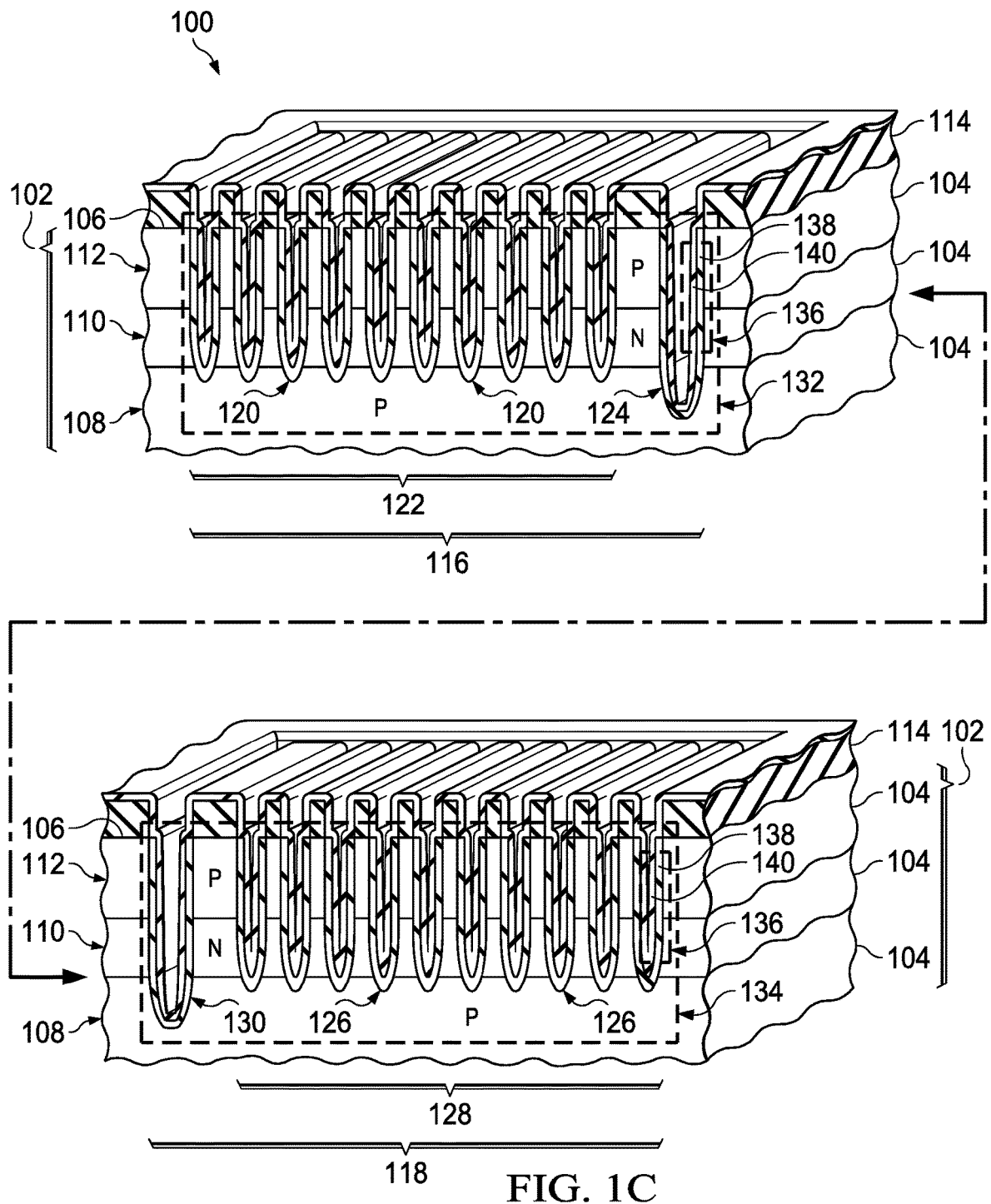

Referring to FIG. 1C, a liner 136 is concurrently formed on sidewalls of the first continuous deep trench 132 and the second continuous deep trench 134. The liner 136 of this example may include a thermal oxide sublayer 138 on the sidewalls, contacting the semiconductor material 104, and a deposited oxide sublayer 140 on the thermal oxide sublayer 138. The thermal oxide sublayer 138 may be formed by thermal oxidation of the semiconductor material 104 at the sidewalls of the first continuous deep trench 132 and the second continuous deep trench 134, in a furnace process with an ambient including oxygen. The deposited oxide sublayer 140 may be formed by a chemical vapor deposition (CVD) process using dichlorosilane ($SiCl_2H_2$) and oxygen, or using tetraethoxysilane (TEOS), also known as tetraethyl orthosilicate. The CVD process may be a thermal CVD process, such as an atmospheric pressure chemical vapor deposition (APCVD) process, a sub-atmospheric pressure chemical vapor deposition (SACVD) process, or a plasma enhanced chemical vapor deposition (PECVD) process, by way of example. Other sublayers and other materials for the liner 136 are within the scope of this example. The liner 136 may be thicker at bottoms of the pad trench segments 120 and 126 than at bottoms of the contact trench segments 124 and 130, as a result of the contact trench segments 124 and 130 being wider than the pad trench segments 120 and 126.

Figure 1D:
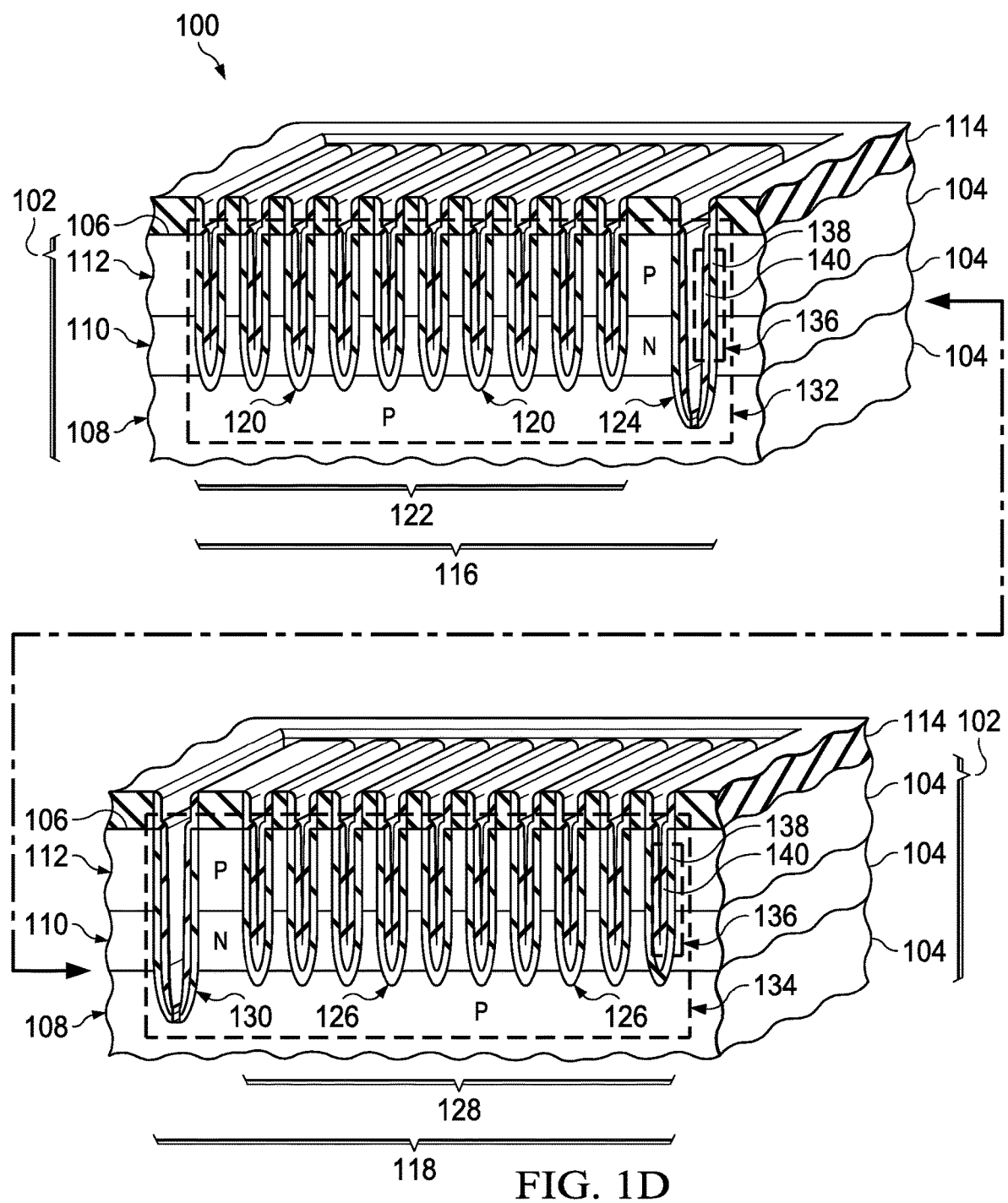

Referring to FIG. 1D, the liner 136 is removed from bottoms of the contact trench segments 124 and 130, so that the semiconductor material 104 is exposed at the bottoms of the contact trench segments 124 and 130. At least a portion of the liner 136 is left in place in the pad trench segments 120 and 126, so that the liner 136 covers the sidewalls and bottoms of the pad trench segments 120 and 126. The liner 136 may be removed from bottoms of the contact trench segments 124 and 130 by an RIE process using fluorine radicals with a highly directional velocity distribution, which etches the liner 136 at the bottoms of the contact trench segments 124 and 130 but does not significantly etch the liner 136 along the sidewalls of the contact trench segments 124. The RIE process may be a blanket etch process, in which all areas of the microelectronic device 100 are exposed to the RIE etch. Alternatively, the RIE process may be a masked process, in which a mask is formed over the microelectronic device 100 that exposes only areas to be etched. The process to remove the liner 136 from the bottoms of the contact trench segments 124 and 130 may be a timed etch process, or an endpointed etch process. The liner 136 is not completely removed from the bottoms of the pad trench segments 120 and 126, as a result of the liner 136 being thicker at the bottoms of the pad trench segments 120 and 126, than at the bottoms of the contact trench segments 124 and 130.

Figure 1E:
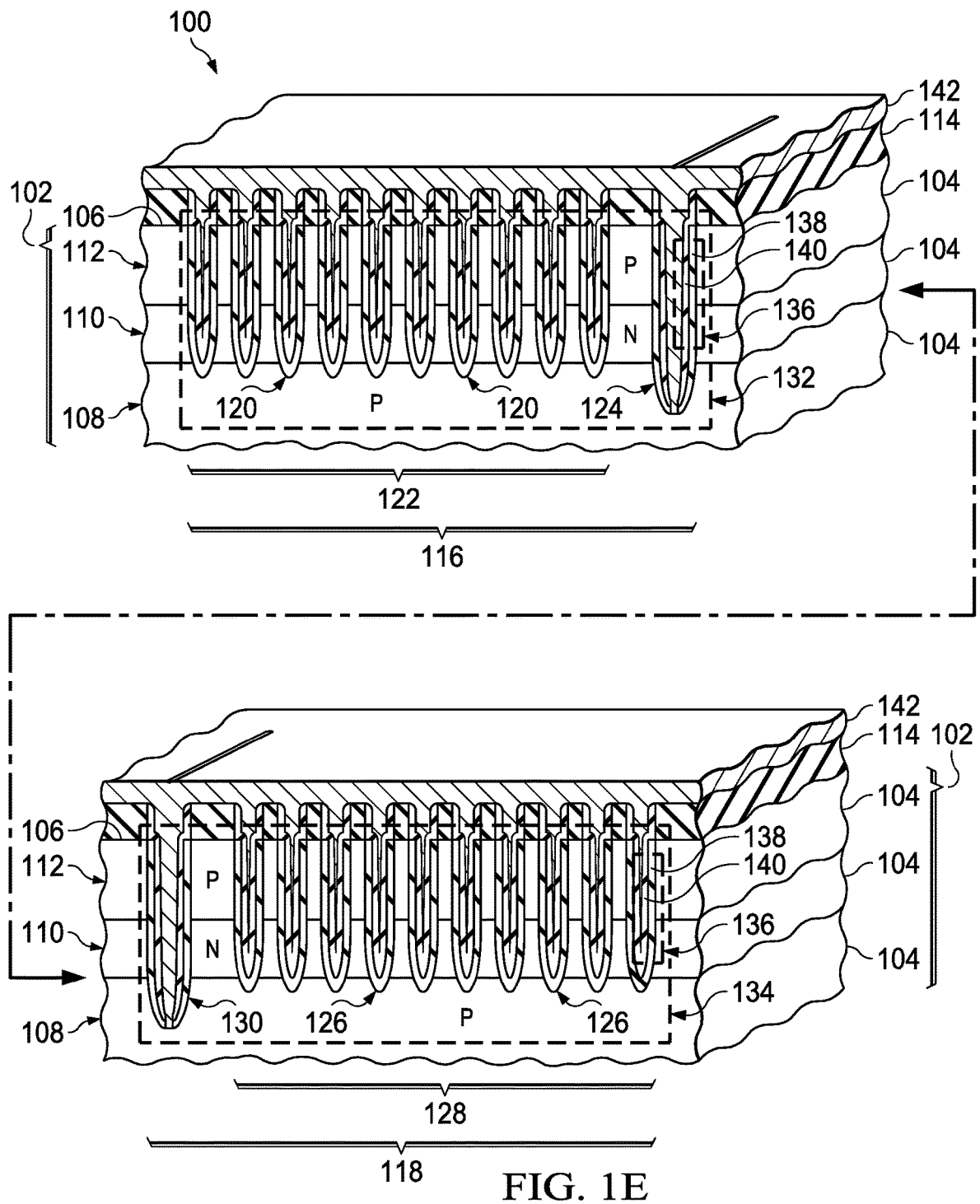

Referring to FIG. 1E, a trench fill material 142 is formed in the first continuous deep trench 132 and the second continuous deep trench 134, contacting the liner 136 and contacting the semiconductor material 104 at the bottoms of the contact trench segments 124 and 130. The trench fill material 142 is electrically conductive. This may advantageously provide a contact to the base layer 108 from the top of the substrate 102. The trench fill material 142 is separated from the semiconductor material 104 in the pad trench segments 120 and 126 by the liner 136. The trench fill material 142 extends continuously through the first continuous deep trench 132, so that the trench fill material 142 in each of the first pad trench segments 120 is continuous with the trench fill material 142 in the other first pad trench segments 120, and so that the trench fill material 142 in the first pad trench segments 120 is continuous with the trench fill material 142 in the first contact trench segment 124. Similarly, the trench fill material 142 extends continuously through the second continuous deep trench 134, so that the trench fill material 142 in each of the second pad trench segments 126 is continuous with the trench fill material 142 in the other second pad trench segments 126, and so that the trench fill material 142 in the second pad trench segments 126 is continuous with the trench fill material 142 in the second contact trench segment 130. The trench fill material 142 may include polysilicon, and may be formed by thermal decomposition of silane ($SiH_4$) or disilane ($Si_2H_6$). Alternatively, the trench fill material 142 may include tungsten, formed by reduction of tungsten hexafluoride ($WF_6$). Other trench fill materials are within the scope of this example. The trench fill material 142 may extend over the top surface 106 of the substrate 102, and over the etch mask 114, if present, as depicted in FIG. 1E.

Figure 1F:
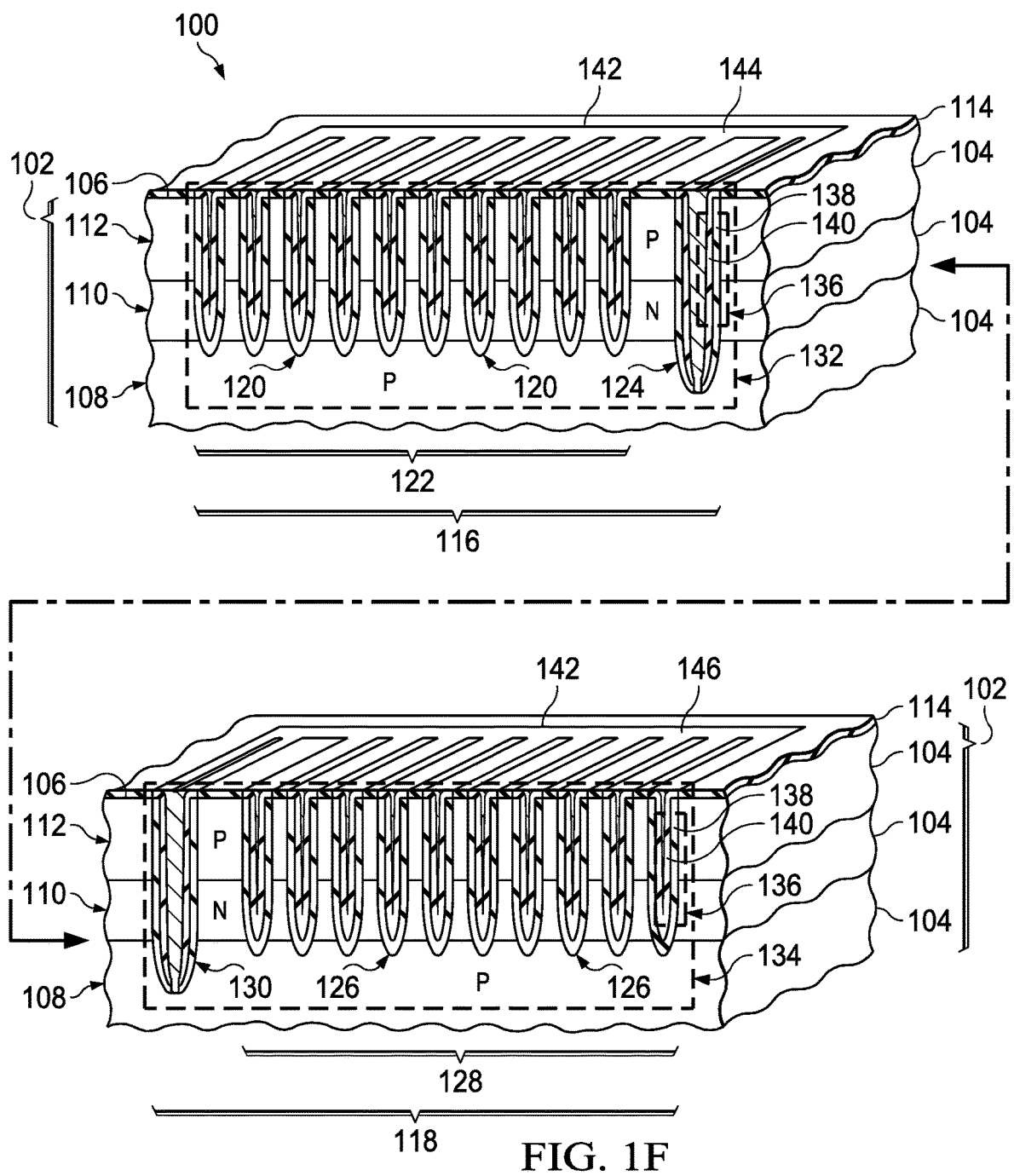

Referring to FIG. 1F, the trench fill material 142 over the top surface 106 of the substrate 102 is removed, leaving the trench fill material 142 in the first continuous deep trench 132 and the second continuous deep trench 134. The trench fill material 142 over the top surface 106 of the substrate 102 may be removed by an etchback process using a plasma process which removes the etch mask 114 of FIG. 1E at a similar rate to the trench fill material 142. The process of removing 142 may leave a portion of the etch mask 114 in place as shown in FIG. 1F. After the trench fill material 142 is removed from over the top surface 106 of the substrate 102, the trench fill material 142 extends to a first probe surface 144 at tops of the first pad trench segments 120, and extends to a second probe surface 146 at tops of the second pad trench segments 126. The first probe surface 144 of the first pad trench segments 120 is located proximate to, and parallel to, the top surface 106 of the substrate 102, and similarly for the second probe surface 146 of the second pad trench segments 126. The trench fill material 142 at the first probe surface 144 of the first pad trench segments 120 occupies at least 25 percent of the first probe pad region 122. Similarly, the trench fill material 142 at the second probe surface 146 of the second pad trench segments 126 occupies at least 25 percent of the second probe pad region 128.

Figure 1G:
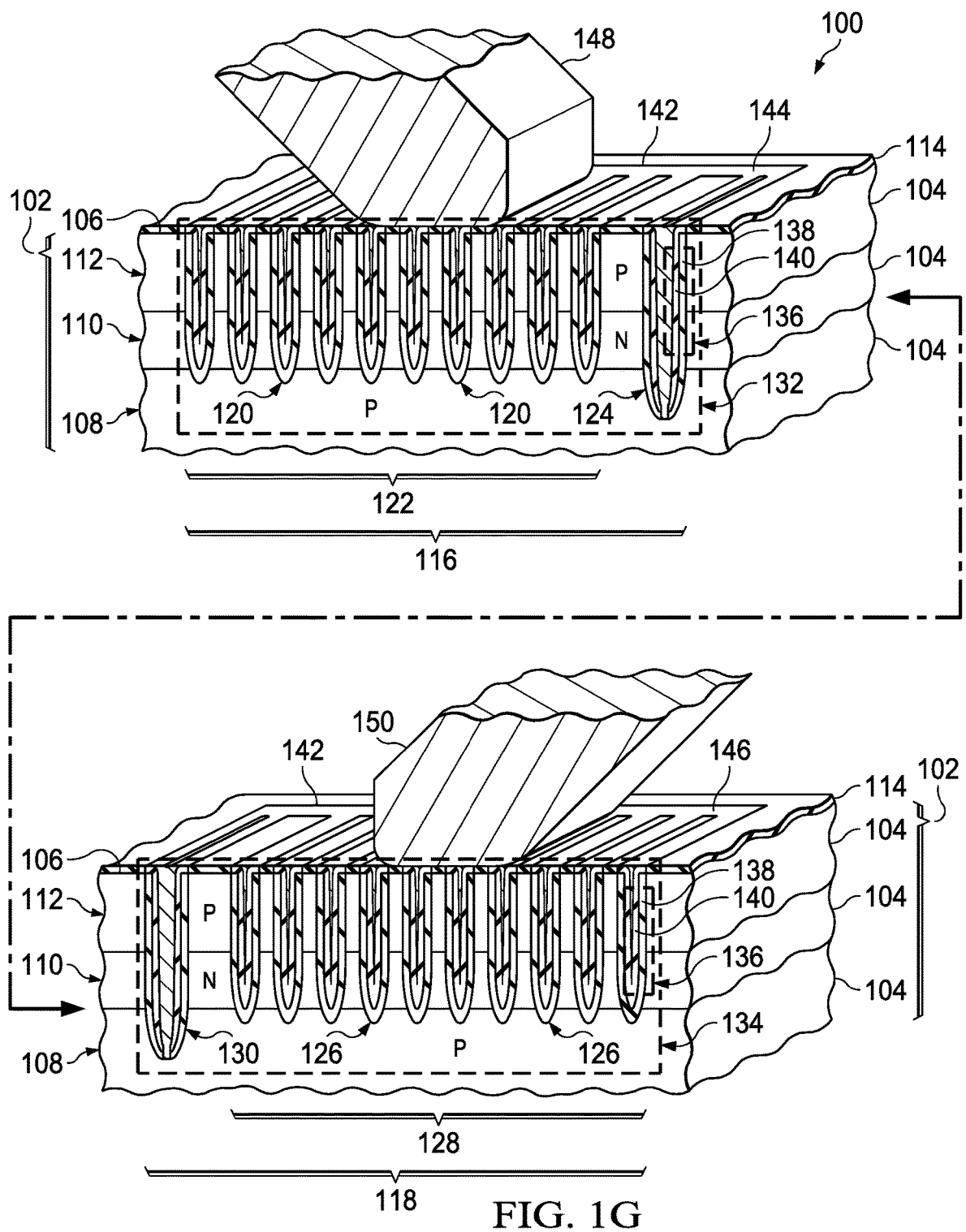

Referring to FIG. 1G, a first probe 148 is disposed on the trench fill material 142 in the first probe pad region 122, making an electrical contact with the trench fill material 142 in the pad trench segments 120. A second probe 150 is disposed on the trench fill material 142 in the second probe pad region 128, making an electrical contact with the trench fill material 142 in the second pad trench segments 126.

In this example, a value of an electrical impedance between the trench fill material 142 and the semiconductor material 104 below a target value may be desired for proper operation and reliability of the microelectronic device. A first estimate of the electrical impedance between the trench fill material 142 and the semiconductor material 104 of the substrate 102 may be made using a measured impedance from the first probe 148 to the second probe 150. The measured impedance may thus be obtained by measuring an impedance from the first probe 148, through the electrical contact between the first probe 148 and the trench fill material 142 in the first deep trench test structure 116, through the trench fill material 142 between the first pad trench segments 120 and the first contact trench segment 124, through an interface between the trench fill material 142 in the first contact trench segment 124 and the semiconductor material 104, through the semiconductor material 104 between the first contact trench segment 124 and the second contact trench segment 130, through an interface between the semiconductor material 104 and the trench fill material 142 in the second contact trench segment 130, through the trench fill material 142 between the second contact trench segment 130 and the second pad trench segments 126, through the electrical contact between the trench fill material 142 in the second deep trench test structure 118 and the second probe 150, and to the second probe 150. The first estimate of the electrical impedance between the trench fill material 142 and the semiconductor material 104 of the substrate 102 may be obtained from the measured impedance by accounting for impedances of the electrical contact between the first probe 148 and the trench fill material 142 in the first deep trench test structure 116, the trench fill material 142 between the first pad trench segments 120 and the first contact trench segment 124, the semiconductor material 104 between the first contact trench segment 124 and the second contact trench segment 130, the trench fill material 142 between the second contact trench segment 130 and the second pad trench segments 126, and the electrical contact between the trench fill material 142 in the second deep trench test structure 118 and the second probe 150.

Having the trench fill material 142 at the first probe surface 144 of the first pad trench segment 120 occupy at least 25 percent of the first probe pad region 122 may provide a low resistance for the electrical contact between the first probe 148 and the trench fill material 142 in the first deep trench test structure 116, enabling a reliable, consistent measurement of the measured impedance, thus advantageously providing an accurate estimate of the electrical impedance between the trench fill material 142 and the semiconductor material 104 of the substrate 102, compared to probing on a single deep trench segment. Similarly, having the trench fill material 142 at the second probe surface 146 of the second pad trench segment 126 occupy at least 25 percent of the second probe pad region 128 may provide a low resistance for the electrical contact between the second probe 150 and the trench fill material 142 in the second deep trench test structure 118, accruing a similar advantage. Using the first deep trench test structure 116 and the second deep trench test structure 118 to estimate the electrical impedance between the trench fill material 142 and the semiconductor material 104 may enable probing at the top surface 106 of the substrate 102, without need to make direct contact to the semiconductor material 104. This may be particularly advantageous if the substrate is covered with dielectric layers such as silicon dioxide. Having an accurate estimate for the electrical impedance between the trench fill material 142 and the semiconductor material 104 after forming the deep trench test structures 116 and 118, and before executing additional fabrication steps such as formation of transistors and interconnects, may reduce a cost of operating a fabrication facility making the microelectronic device 100 by enabling discarding substrates with impedances that are out of specification.

Figure 1H:
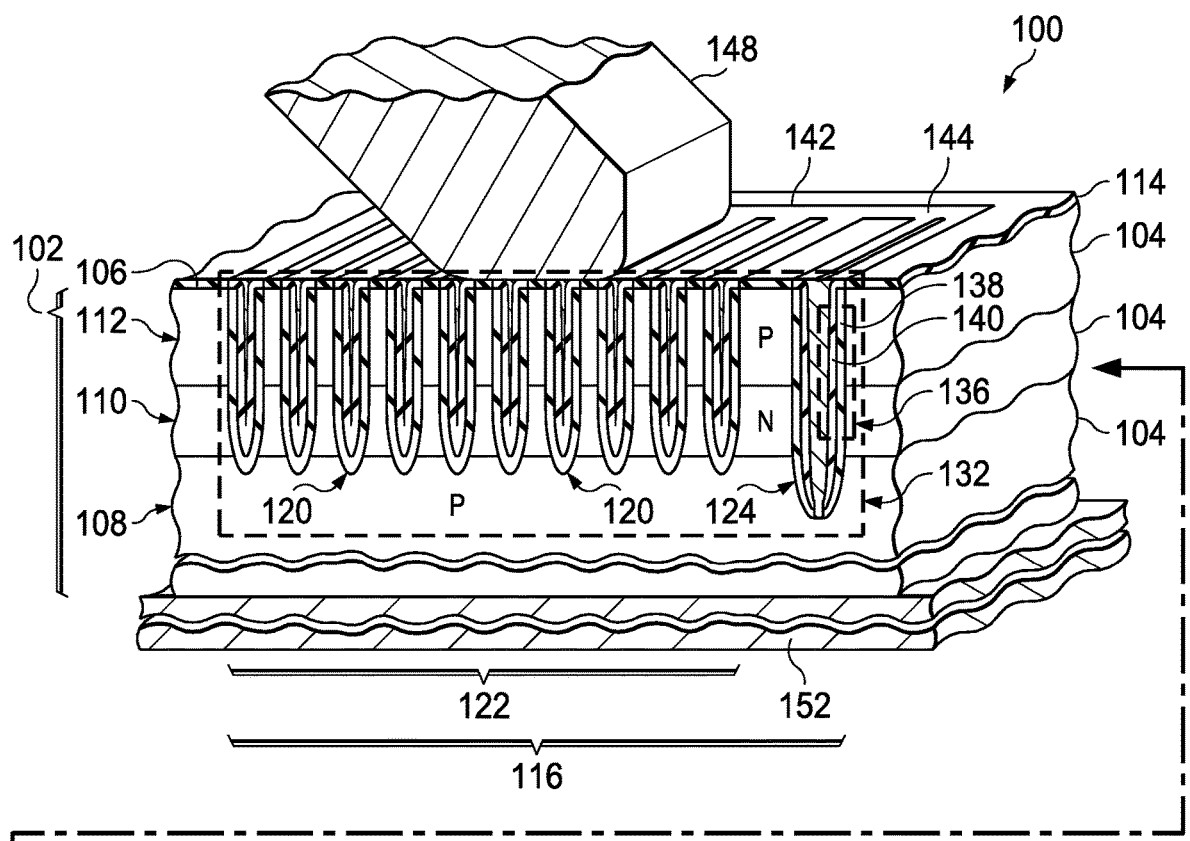
Figure 1H:
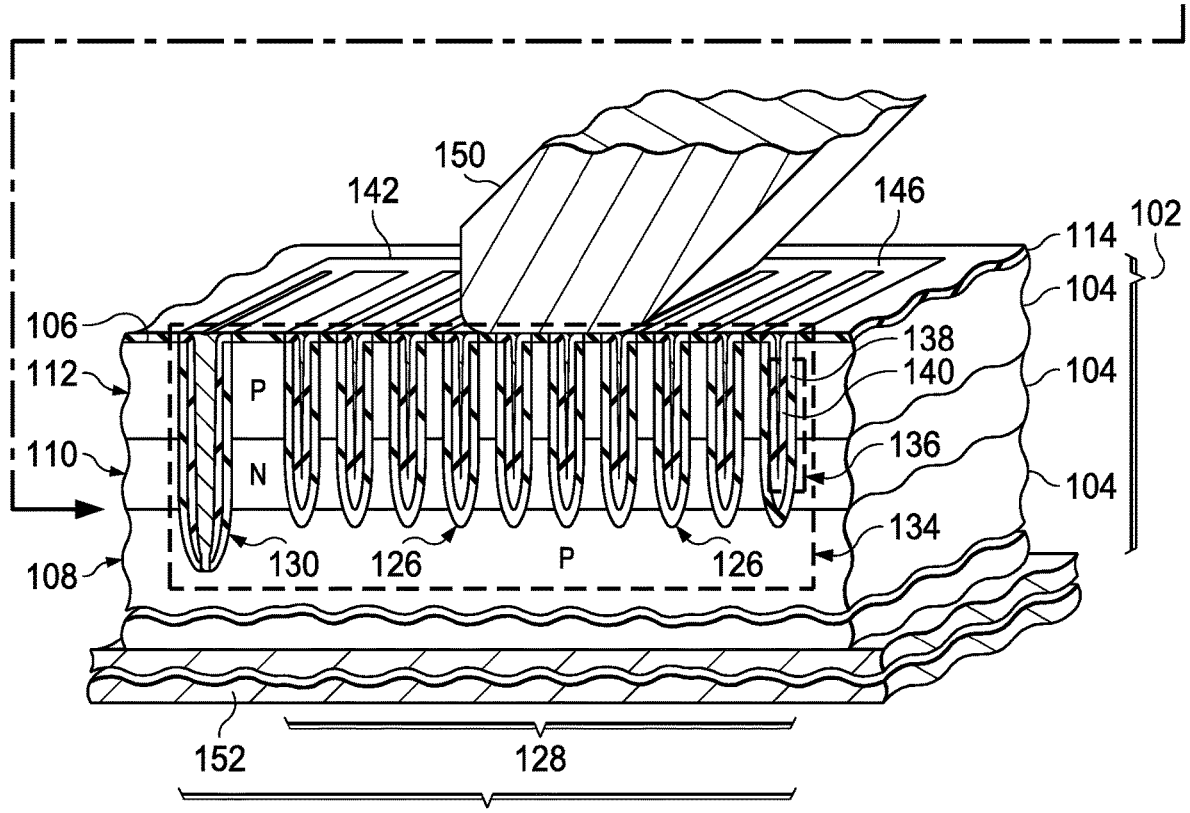

Referring to FIG. 1H, a third probe 152 may optionally be disposed on the substrate 102, making an electrical contact to the semiconductor material 104. The third probe 152 may be implemented as a wafer chuck 152 contacting a back surface of the substrate 102, as depicted in FIG. 1H. Alternatively, the third probe may be implemented as a front side probe making contact with the substrate 102 at the top surface 106. Other implementations of the third probe 152 are within the scope of this example. Implementing the third probe 152 may be advantageous when the semiconductor material 104 is exposed at the back surface of the substrate 102 and at the top surface 106.

A second estimate of the electrical impedance between the trench fill material 142 and the semiconductor material 104 of the substrate 102 may be made using a measured impedance from the first probe 148 to the third probe 152. The measured impedance may thus be obtained by measuring an impedance from the first probe 148, through the electrical contact between the first probe 148 and the trench fill material 142 in the first deep trench test structure 116, through the trench fill material 142 between the first pad trench segments 120 and the first contact trench segment 124, through an interface between the trench fill material 142 in the first contact trench segment 124 and the semiconductor material 104, through the semiconductor material 104 between the first contact trench segment 124 and the third probe 152, through the electrical contact between the semiconductor material 104 and the third probe 152, and to the third probe 152. The measured impedance may also be obtained by a similar measurement using the second probe 150 and the third probe 152. The third probe 152 may provide a more reliable measurement than using both the first probe 148 and the second probe 150. In some versions of this example in which the third probe 152 is used, the microelectronic device 100 may include only the first deep trench test structure 116. The first deep trench test structure 116 and the second deep trench test structure 118 of this example may be particularly advantageous for versions of the microelectronic device 100 in which narrow trench segments, which are closed at the bottoms, are formed concurrently with wide trench segments, which are open at the bottoms. Having the first pad trench segments 120 with closed bottoms and having the first contact trench segment 124 located away from the first probe pad region 122 may reduce interference by mechanical stress from the first probe 148 on the measurement, and similarly for the second deep trench test structure 118.

Figure 2A:
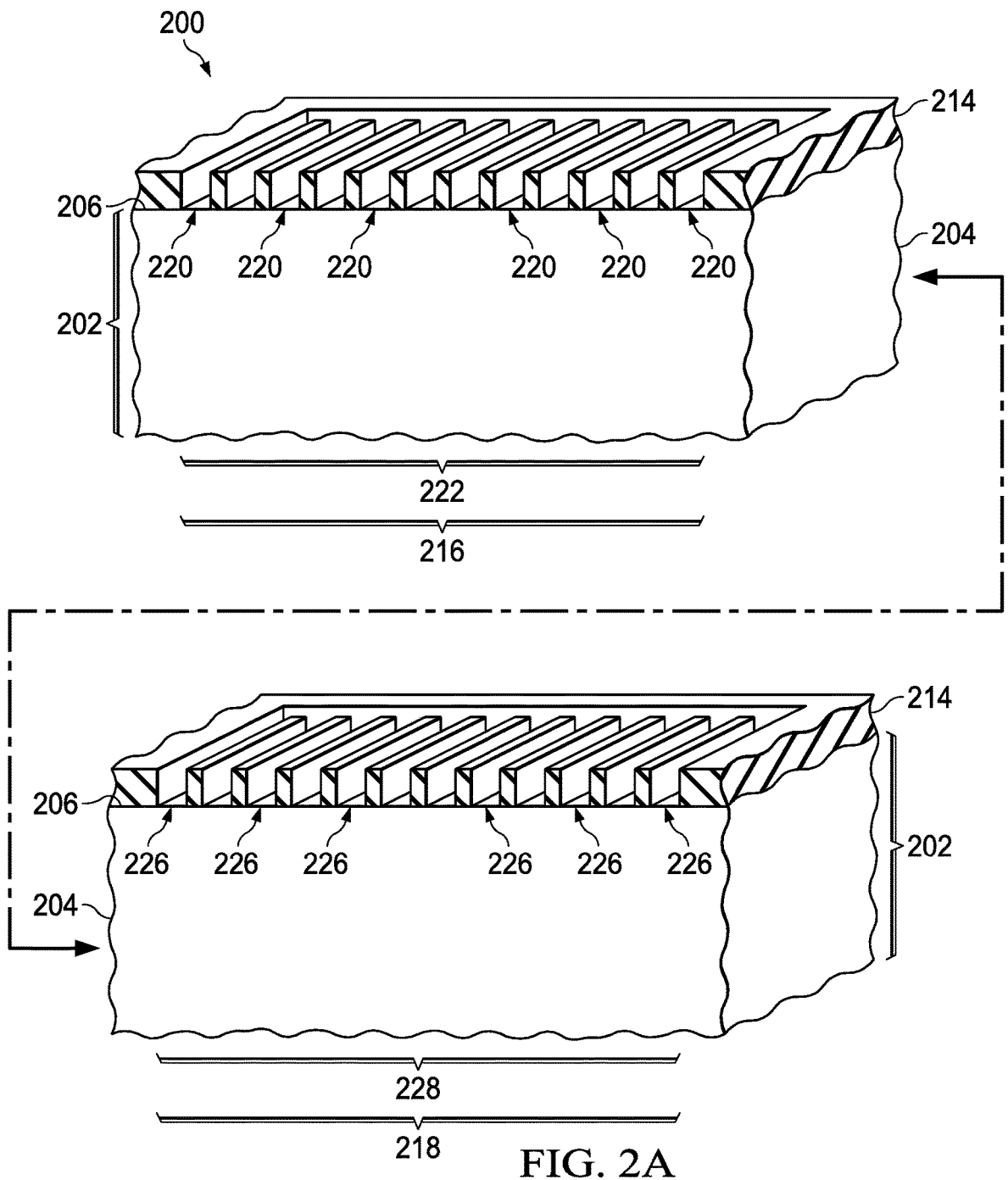
FIG. 2A through FIG. 2H are cross sections of another example microelectronic device, depicted in stages of another example method of formation.

FIG. 2A through FIG. 2H are cross sections of another example microelectronic device, depicted in stages of another example method of formation. Referring to FIG. 2A, the microelectronic device 200 is formed in and on a substrate 202. The substrate 202 includes a semiconductor material 204. The semiconductor material 204 may be implemented as disclosed in reference to FIG. 1A. The substrate 202 may be implemented as a wafer, such as a semiconductor wafer. The semiconductor material 204 extends to a top surface 206 of the substrate 202. The microelectronic device 200 may be implemented as any of the examples disclosed in reference to FIG. 1A.

An etch mask 214 is formed over the top surface 206 of the substrate 202. The etch mask 214 exposes the substrate 202 in an area for a first deep trench test structure 216 and a second deep trench test structure 218. The etch mask 214 may include one or more hard mask materials, and may optionally include photoresist. In this example, the etch mask 214 may expose the substrate 202 in areas for first pad trench segments 220 of the first deep trench test structure 216 which extend across a first probe pad region 222. The first probe pad region 222 extends at least 20 microns in every lateral direction. The areas for the first pad trench segments 220 may be continuous in the area exposed by the etch mask 214, as depicted in FIG. 2A. By way of example, each area for the first pad trench segments 220 may have a width of 1 micron to 3 microns. Similarly, the etch mask 214 may also expose the substrate 202 in areas for second pad trench segments 226 of the second deep trench test structure 218 which extend across a second probe pad region 228. The second probe pad region 228 extends at least 20 microns in every lateral direction. The areas for the second pad trench segments 226 may be continuous in the area exposed by the etch mask 214, as depicted in FIG. 2A. Each area for the second pad trench segments 226 may have a width that is equal to the width of each area for the first pad trench segments 220.

Figure 2B:
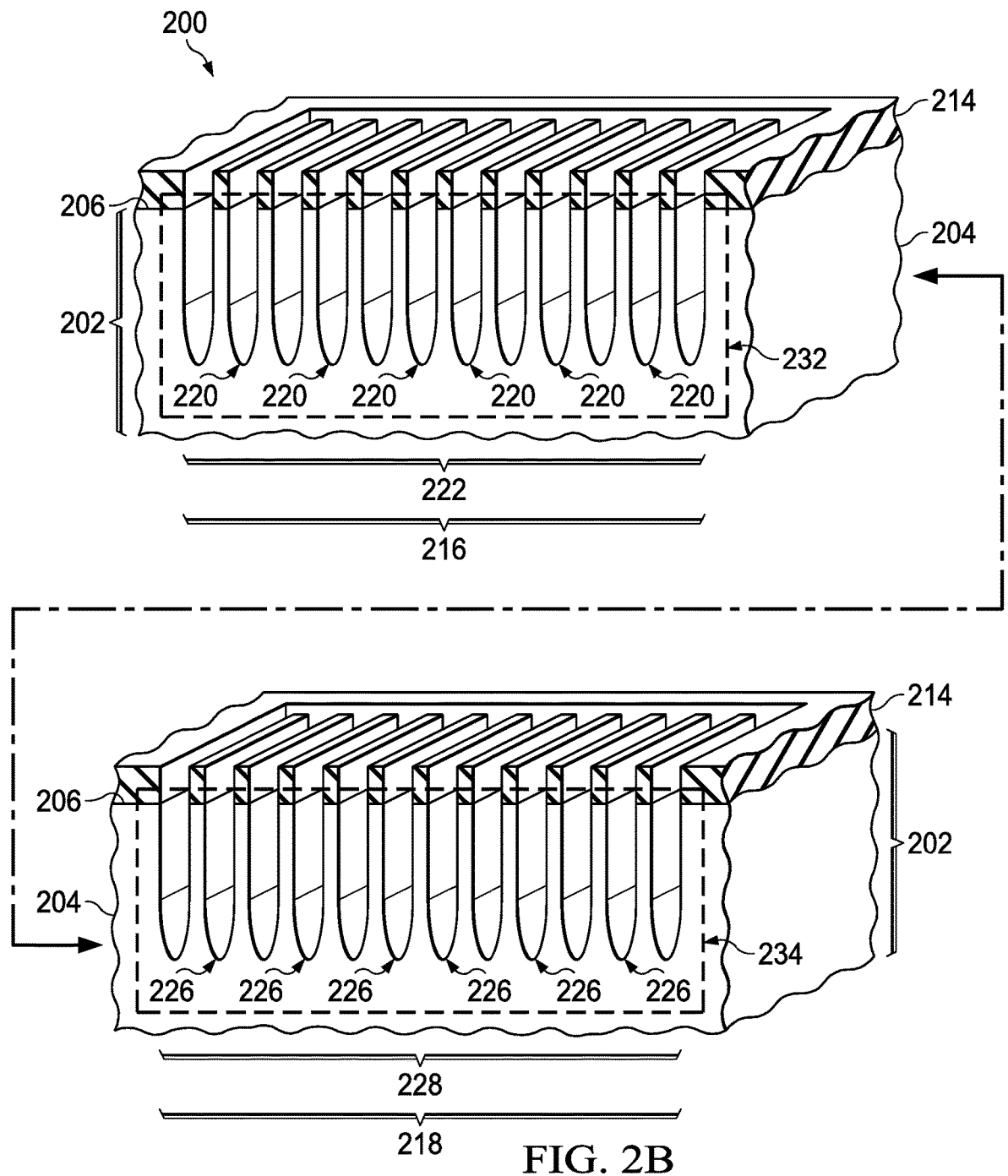

Referring to FIG. 2B, the semiconductor material 204 is removed from the substrate 202 where exposed by the etch mask 214 to form a first continuous deep trench 232 in the substrate 202, and to form a second continuous deep trench 234 in the substrate 202. The first continuous deep trench 232 is part of the first deep trench test structure 216, and the second continuous deep trench 234 is part of the second deep trench test structure 218. The first pad trench segments 220 are connected by being parts of the first continuous deep trench 232. Similarly, the second pad trench segments 226 are connected by being parts of the second continuous deep trench 234. The first continuous deep trench 232 and the second continuous deep trench 234 may extend to depths of 3 microns to 30 microns, for example.

The etch mask 214 may be removed after the first continuous deep trench 232 and the second continuous deep trench 234 are formed. Silicon dioxide in the etch mask 214 may be removed by a wet etch process using a dilute aqueous buffered solution of hydrofluoric acid. Silicon nitride and silicon oxynitride in the etch mask 214 may be removed by a plasma process using fluorine radicals. Other methods for removing the etch mask 214 are within the scope of this example.

Figure 2C:
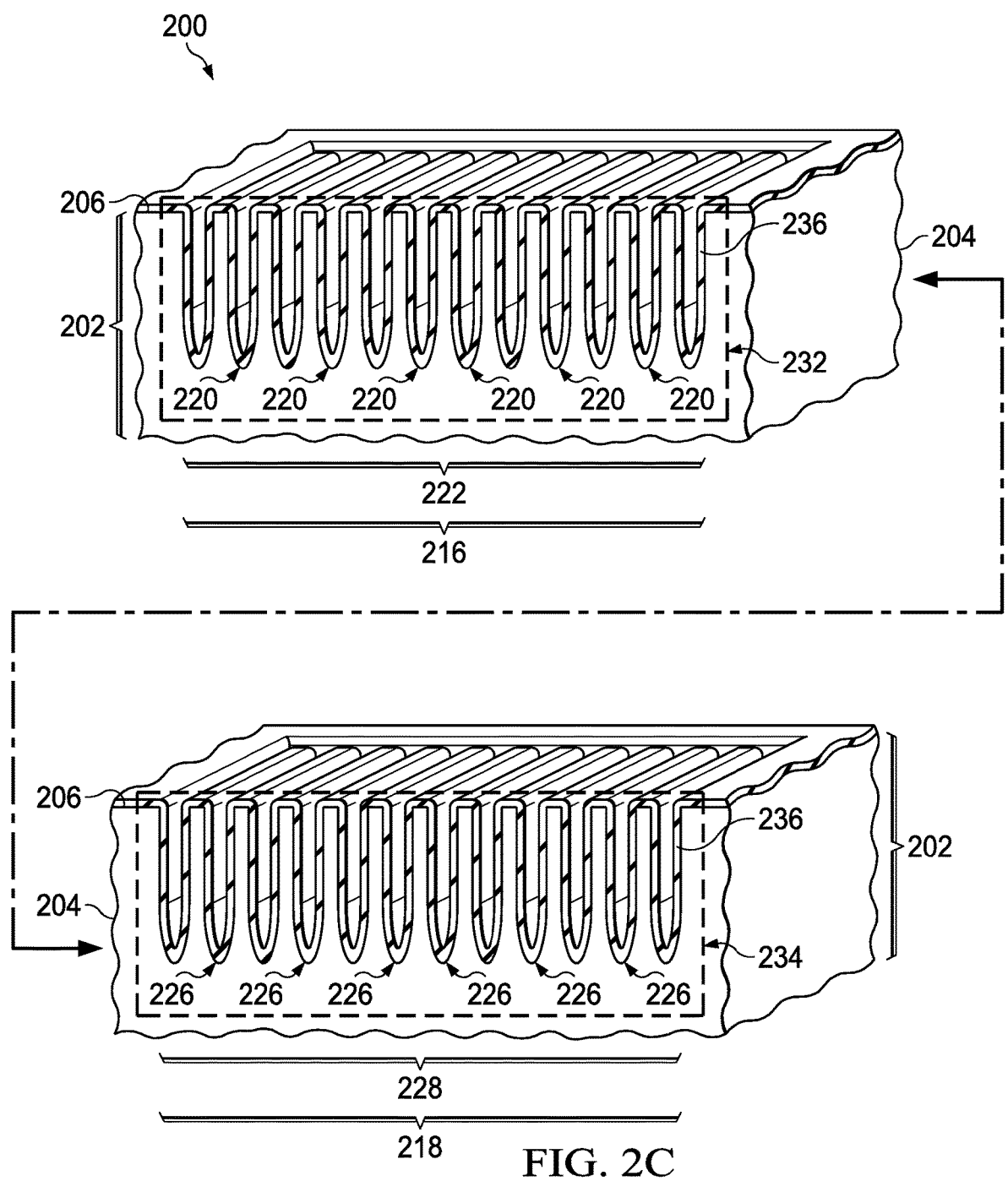

Referring to FIG. 2C, a liner 236 is concurrently formed on sidewalls of the first continuous deep trench 232 and the second continuous deep trench 234. In versions of this example in which the semiconductor material 204 includes primarily silicon, the liner 236 may include a thermal oxide formed by thermal oxidation of the semiconductor material 204 at the sidewalls of the first continuous deep trench 232 and the second continuous deep trench 234, in a furnace process with an ambient including oxygen. In versions of this example in which the semiconductor material 204 includes germanium, silicon carbide, or III-V semiconductor materials such as gallium arsenide or gallium nitride, the liner 236 may include a dielectric material such as silicon dioxide, silicon nitride, silicon oxynitride, or aluminum oxide. By way of example, silicon dioxide in the liner 236 may be formed by a PECVD process, an APCVD process or an SACVD process using TEOS, or silane or dichlorosilane with an oxidizing reagent. Silicon nitride in the liner 236 may be formed by a PECVD process or a thermal CVD process using bis(tertiary butyl amino) silane (BTBAS), or silane and ammonia. Silicon oxynitride in the liner 236 may be formed by a PECVD process using TEOS and BTBAS. Aluminum oxide in the liner 236 may be formed by an atomic layer deposition (ALD) process using trimethyl aluminum and water vapor. Other materials for the liner 236 are within the scope of this example. The liner 236 does not fill the first continuous deep trench 232 or the second continuous deep trench 234. The liner 236 may optionally be formed over the top surface 206 of the substrate 202, as depicted in FIG. 2C.

Figure 2D:
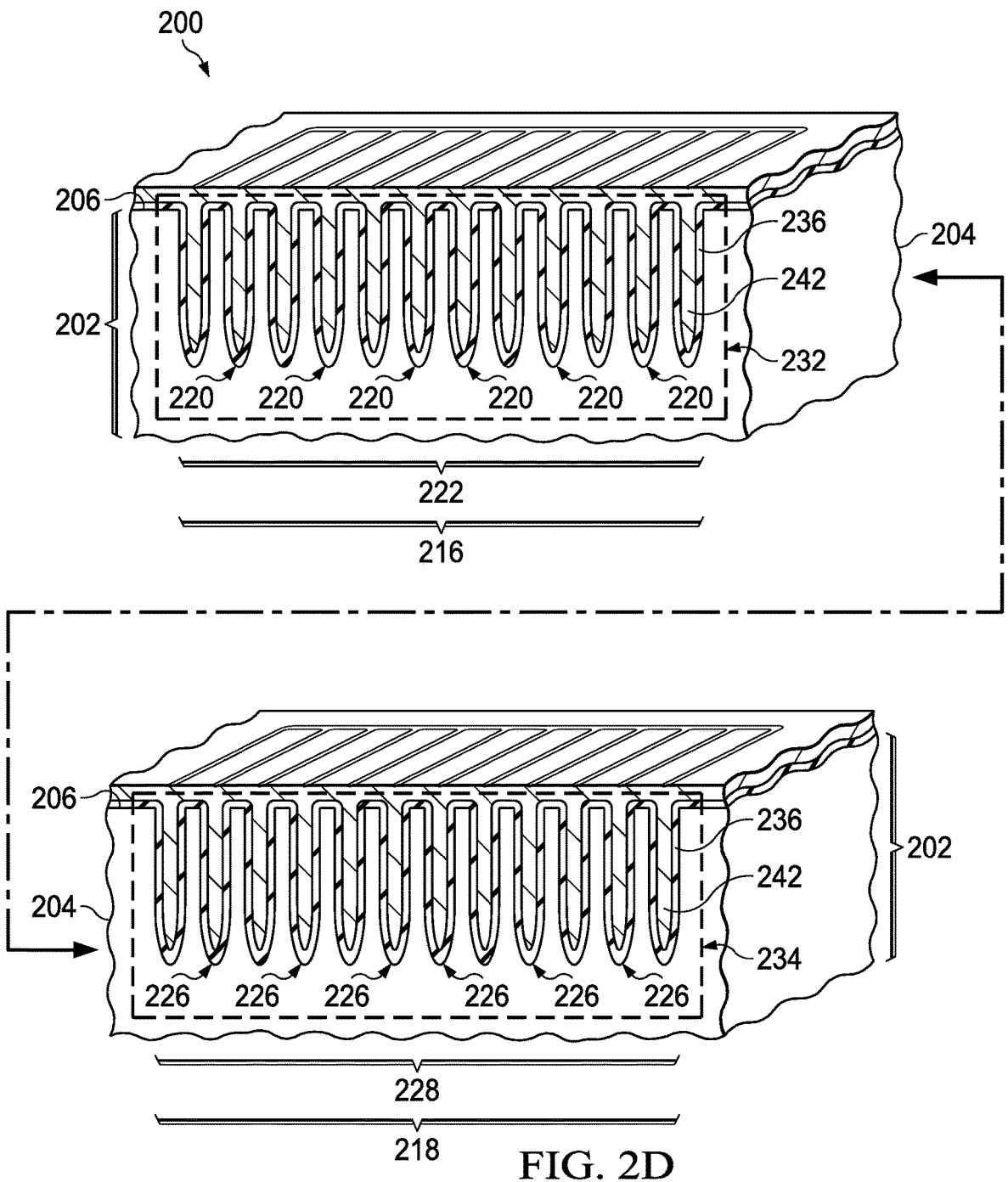

Referring to FIG. 2D, a trench fill material 242 is formed in the first continuous deep trench 232 and the second continuous deep trench 234, contacting the liner 236. The trench fill material 242 is electrically conductive. The trench fill material 242 is separated from the semiconductor material 204 in the pad trench segments 220 and 226 by the liner 236. The trench fill material 242 extends continuously through the first continuous deep trench 232, so that the trench fill material 242 in each of the first pad trench segments 220 is continuous with the trench fill material 242 in the other first pad trench segments 220. Similarly, the trench fill material 242 extends continuously through the second continuous deep trench 234, so that the trench fill material 242 in each of the second pad trench segments 226 is continuous with the trench fill material 242 in the other second pad trench segments 226. The trench fill material 242 may include polysilicon, and may be formed by as disclosed in reference to FIG. 1E. Alternatively, the trench fill material 242 may include tungsten, and may be formed by as disclosed in reference to FIG. 1E. Other trench fill materials are within the scope of this example. The trench fill material 242 may extend over the top surface 206 of the substrate 202, as depicted in FIG. 2D.

Figure 2E:
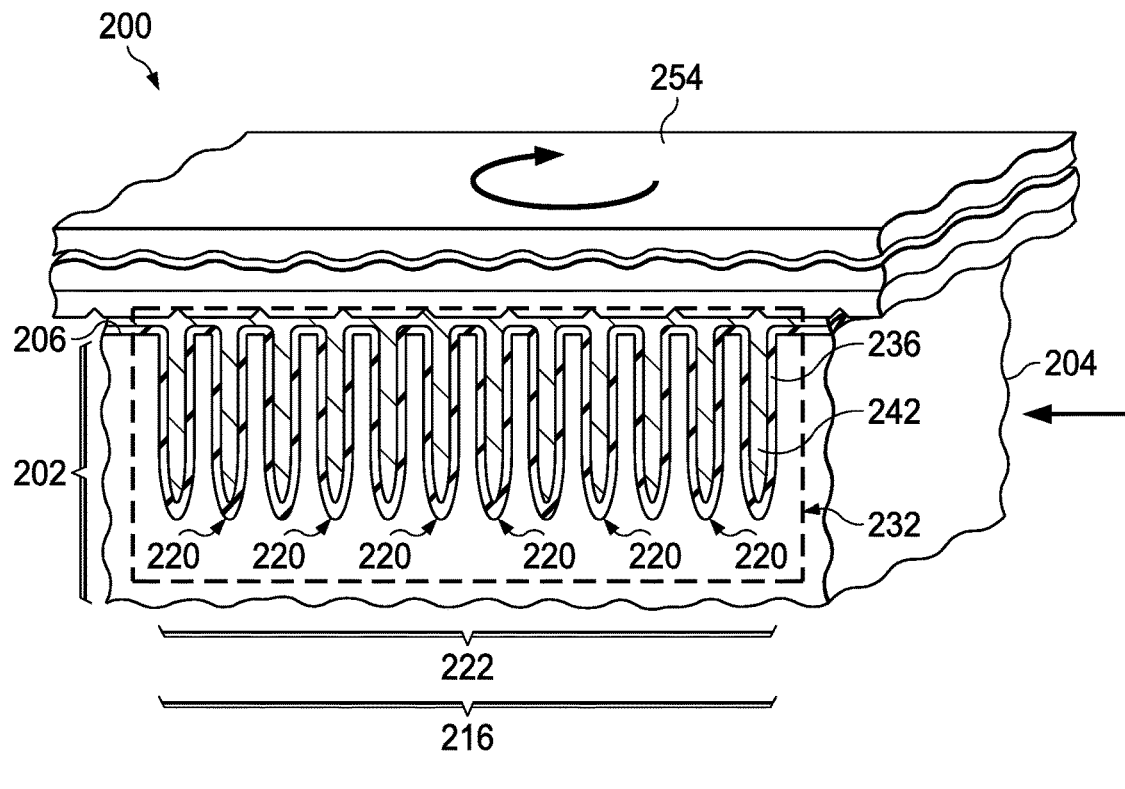
Figure 2E:
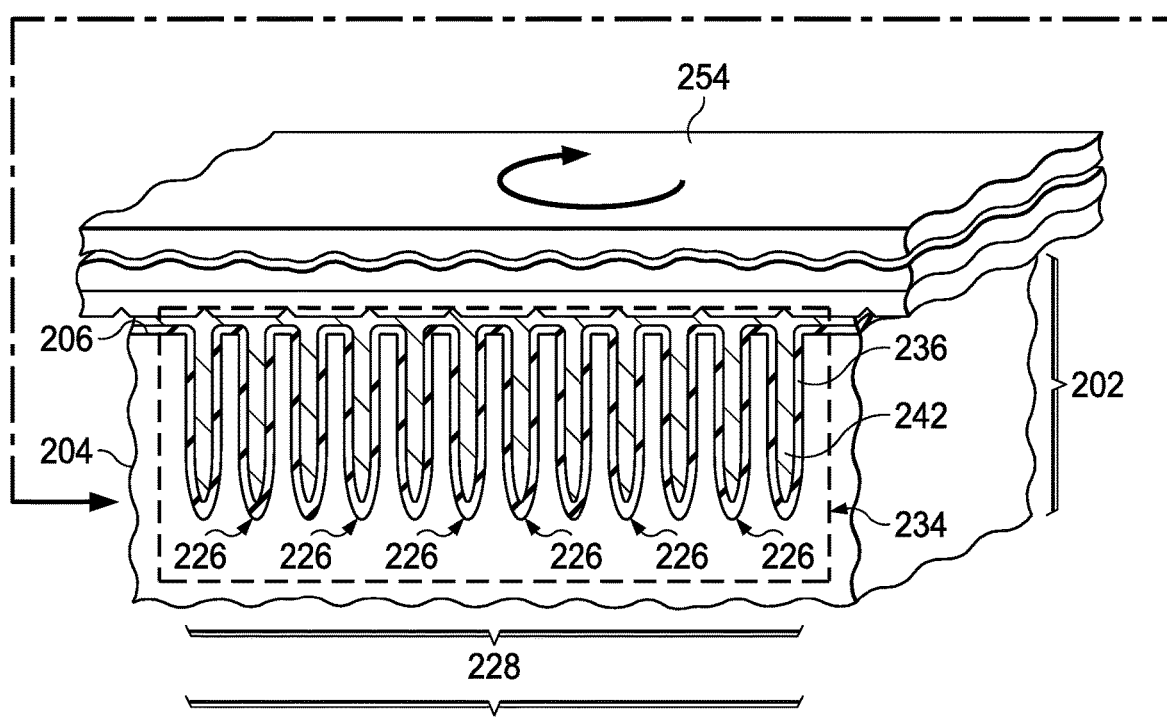

Referring to FIG. 2E, the trench fill material 242 over the top surface 206 of the substrate 202 is removed, leaving the trench fill material 242 in the first continuous deep trench 232 and the second continuous deep trench 234. The trench fill material 242 over the top surface 206 of the substrate 202 may be removed by chemical mechanical polish (CMP) process using a CMP pad 254, by way of example. FIG. 2E depicts removal of the trench fill material 242 from over the top surface 206 partway to completion. Other processes for removing the trench fill material 242 from over the top surface 206, such as an etch back process, are within the scope of this example.

Figure 2F:
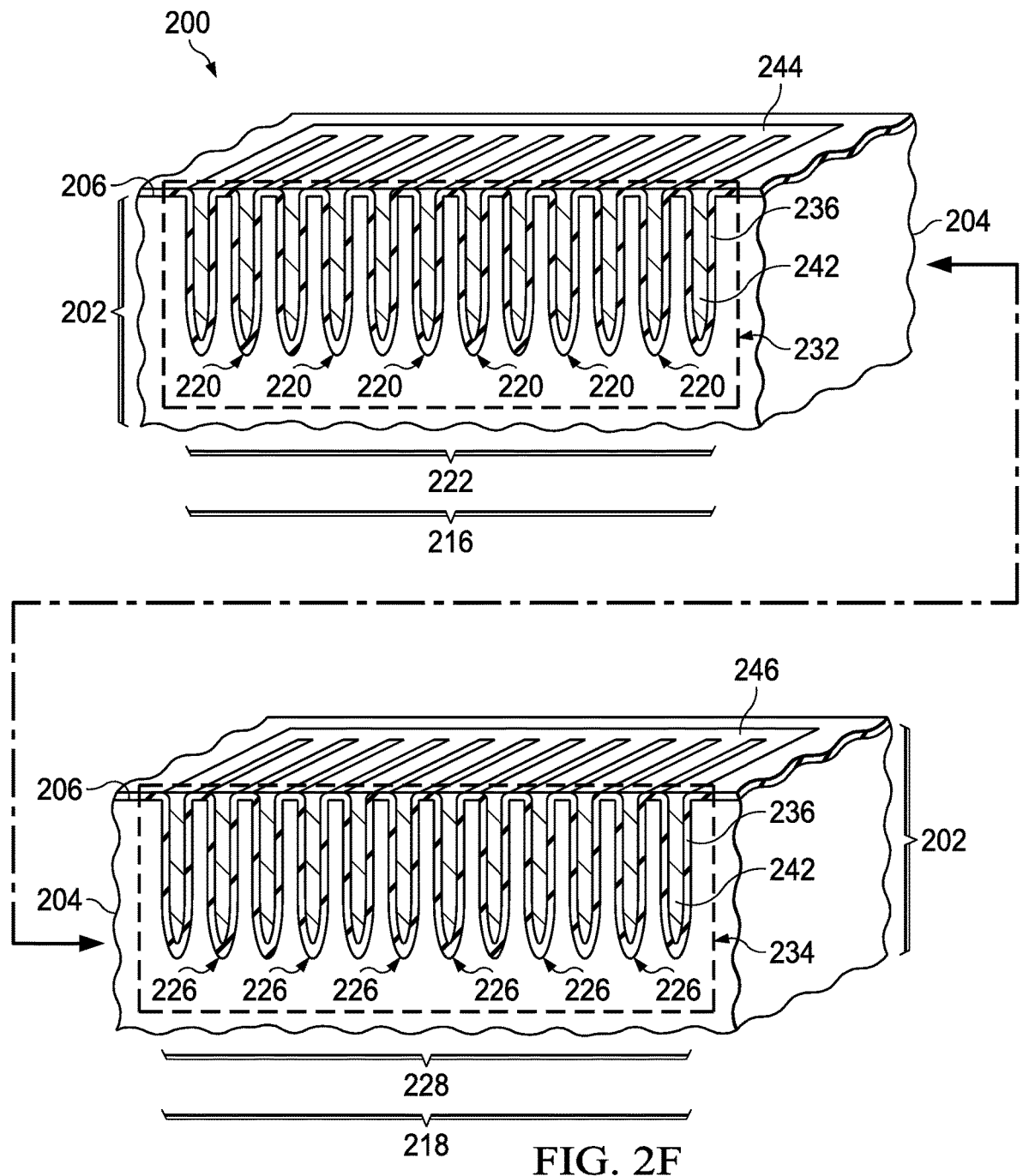

FIG. 2F depicts the microelectronic device 200 after removal of the trench fill material 242 from over the top surface 206 is completed. In this example, the trench fill material 242 in the first continuous deep trench 232 and the second continuous deep trench 234 is electrically isolated from the semiconductor material 204 by the liner 236. After the trench fill material 242 is removed from over the top surface 206 of the substrate 202, the trench fill material 242 extends to a first probe surface 244 at tops of the first pad trench segments 220 and extends to a first probe surface 244 at tops of the second pad trench segments 226. The first probe surface 244 of the first pad trench segments 220 is located proximate to, and parallel to, the top surface 206 of the substrate 202, and similarly for the second probe surface 246 of the second pad trench segments 226. The trench fill material 242 at the first probe surface 244 of the first pad trench segment 220 occupies at least 25 percent of the first probe pad region 222. Similarly, the trench fill material 242 at the second probe surface 246 of the second pad trench segment 226 occupies at least 25 percent of the second probe pad region 228.

Figure 2G:
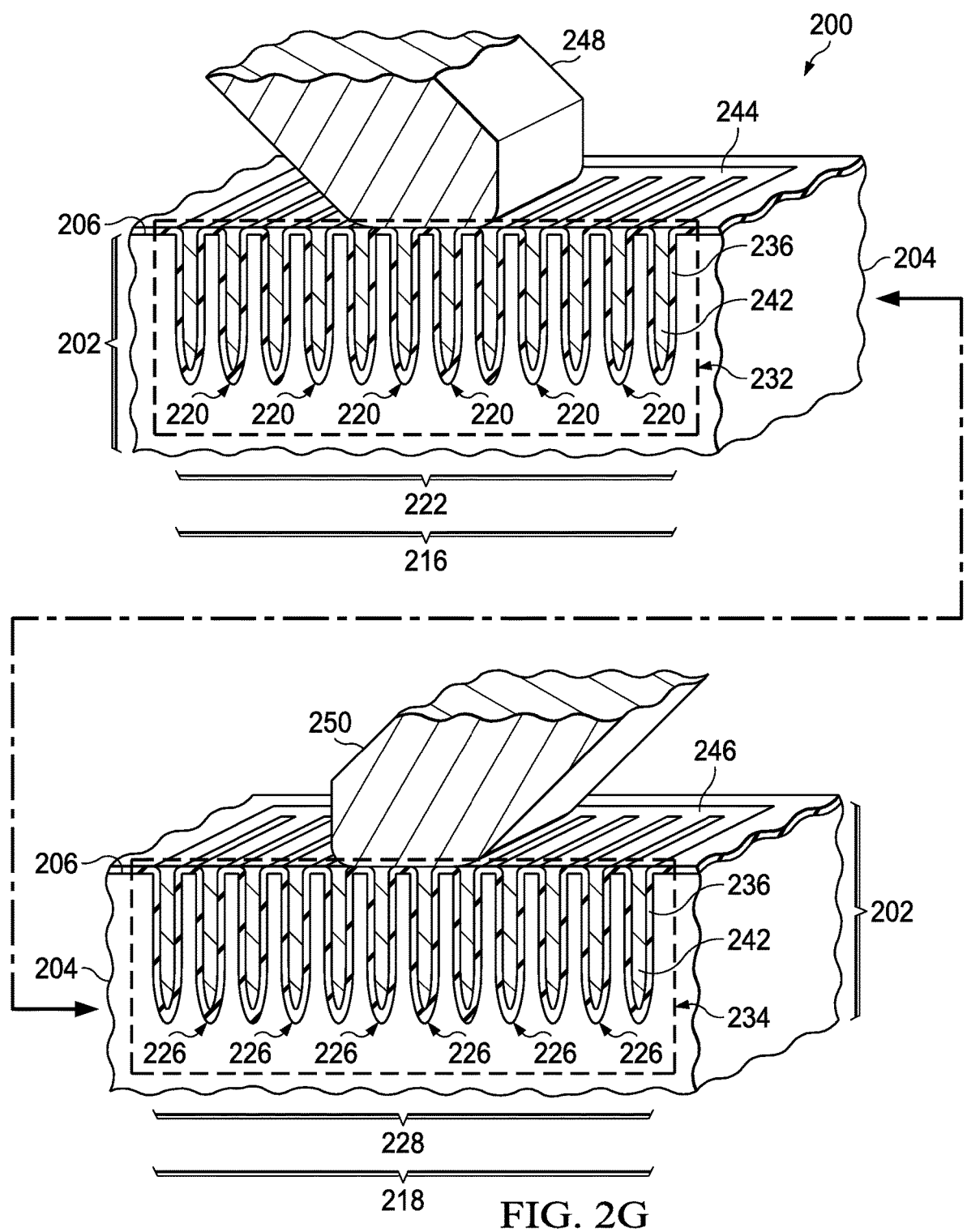

Referring to FIG. 2G, a first probe 248 is disposed on the trench fill material 242 in the first probe pad region 222, making an electrical contact with the trench fill material 242 in the pad trench segments 220. A second probe 250 is disposed on the trench fill material 242 in the second probe pad region 228, making an electrical contact with the trench fill material 242 in the second pad trench segments 226. In this example, a value of an electrical impedance between the trench fill material 242 and the semiconductor material 204 above a target value, for example, $10^{12}$ ohms, may be desired for proper operation and reliability of the microelectronic device. A first estimate of the electrical impedance between the trench fill material 242 and the semiconductor material 204 of the substrate 202 may be made using a measured impedance from the first probe 248 to the second probe 250. The measured impedance may thus be obtained by measuring an impedance from the first probe 248, through the electrical contact between the first probe 248 and the trench fill material 242 in the first deep trench test structure 216, through the trench fill material 242 in the first pad trench segments 220, through the liner 236 between the trench fill material 242 in the first pad trench segments 220 and the semiconductor material 204, through the semiconductor material 204 between the first pad trench segments 220 and the second pad trench segments 226, through the liner 236 between the semiconductor material 204 and the trench fill material 242 in the second pad trench segments 226, through the trench fill material 242 in the second pad trench segments 226, through the electrical contact between the trench fill material 242 in the second deep trench test structure 218 and the second probe 250, and to the second probe 250. In this example, the electrical impedance through the liner 236 between the trench fill material 242 and the semiconductor material 204 of the substrate 202, above $10^{12}$ ohms, may be significantly larger than all the other impedance contributions, less than $10^6$ ohms, to the measured impedance, so that the first estimate of the electrical impedance between the trench fill material 242 and the semiconductor material 204 of the substrate 202 may be approximated by the measured impedance and discounting the other impedance contributions.

Having the trench fill material 242 at the first probe surface 244 of the first pad trench segment 220 occupy at least 25 percent of the first probe pad region 222 may provide a reliable electrical contact between the first probe 248 and the trench fill material 242 in the first deep trench test structure 216, enabling a reliable, consistent measurement of the measured impedance, thus advantageously providing an accurate estimate of the electrical impedance between the trench fill material 242 and the semiconductor material 204 of the substrate 202, compared to probing on a single deep trench segment. Similarly, having the trench fill material 242 at the second probe surface 246 of the second pad trench segment 226 occupy at least 25 percent of the second probe pad region 228 may provide a reliable electrical contact between the second probe 250 and the trench fill material 242 in the second deep trench test structure 218, accruing a similar advantage. Using the first deep trench test structure 216 and the second deep trench test structure 218 to estimate the electrical impedance between the trench fill material 242 and the semiconductor material 204 may enable probing at the top surface 206 of the substrate 202, without need to make direct contact to the semiconductor material 204, accruing the advantages disclosed in reference to FIG. 1G. Having an accurate estimate for the electrical impedance between the trench fill material 242 and the semiconductor material 204 after forming the deep trench test structures 216 and 218, and before executing additional fabrication steps, may reduce a cost of operating a fabrication facility making the microelectronic device 200, as disclosed in reference to FIG. 1G.

Figure 2H:
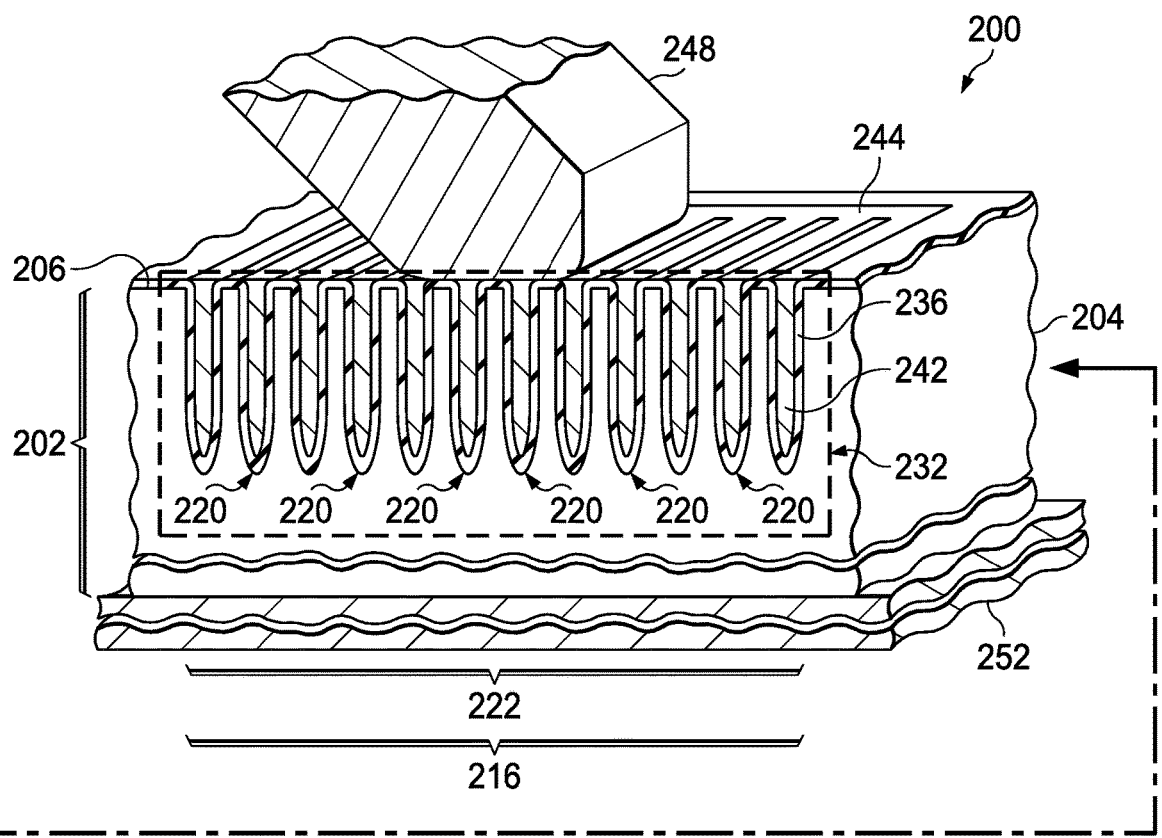
Figure 2H:
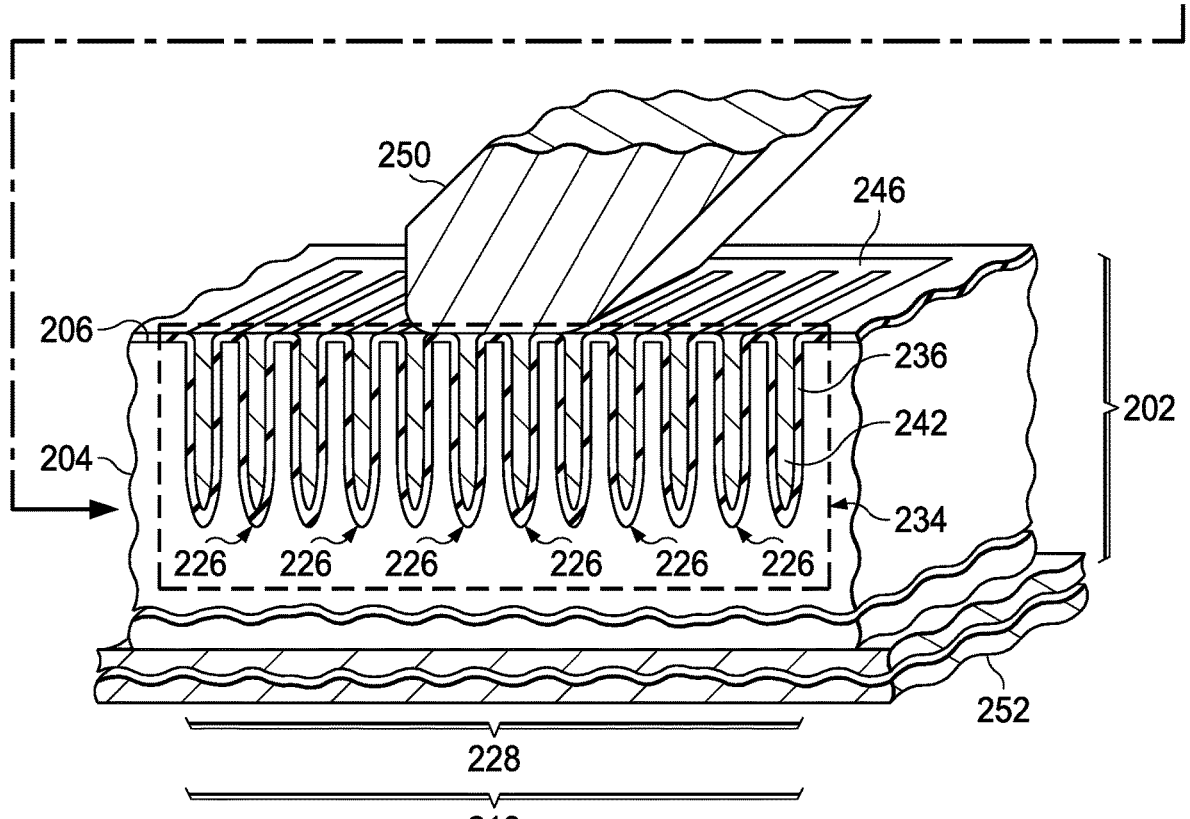

Referring to FIG. 2H, a third probe 252 may optionally be disposed on the substrate 202, making an electrical contact to the semiconductor material 204. The third probe 252 may be implemented as a wafer chuck 252 contacting a back surface of the substrate 202, as depicted in FIG. 2H, or as a front side probe making contact with the substrate 202 at the top surface 206. Other implementations of the third probe 252 are within the scope of this example.

A second estimate of the electrical impedance between the trench fill material 242 and the semiconductor material 204 of the substrate 202 may be made using a measured impedance from the first probe 248 to the third probe 252. The measured impedance may thus be obtained by measuring an impedance from the first probe 248, through the electrical contact between the first probe 248 and the trench fill material 242 in the first deep trench test structure 216, through the trench fill material 242 in the first pad trench segments 220, through the liner 236 between the trench fill material 242 in the first pad trench segments 220 and the semiconductor material 204, through the semiconductor material 204 between the first pad trench segment 220 and the third probe 252, through the electrical contact between the semiconductor material 204 and the third probe 252, and to the third probe 252. The measured impedance may also be obtained by a similar measurement using the second probe 250 and the third probe 252. The third probe 252 may provide a more reliable measurement than using both the first probe 248 and the second probe 250. In some versions of this example in which the third probe 252 is used, the microelectronic device 200 may include only the first deep trench test structure 216. The first deep trench test structure 216 and the second deep trench test structure 218 of this example may be particularly advantageous for versions of the microelectronic device 200 in which only trench segments that are closed at the bottoms are formed as parts of components in the microelectronic device 200. The first deep trench test structure 216 and the second deep trench test structure 218 can be formed concurrently with the trench segments to provide a capability to assess the electrical impedance between the trench fill material 242 and the semiconductor material 204 of the substrate 202.

Figure 3A:
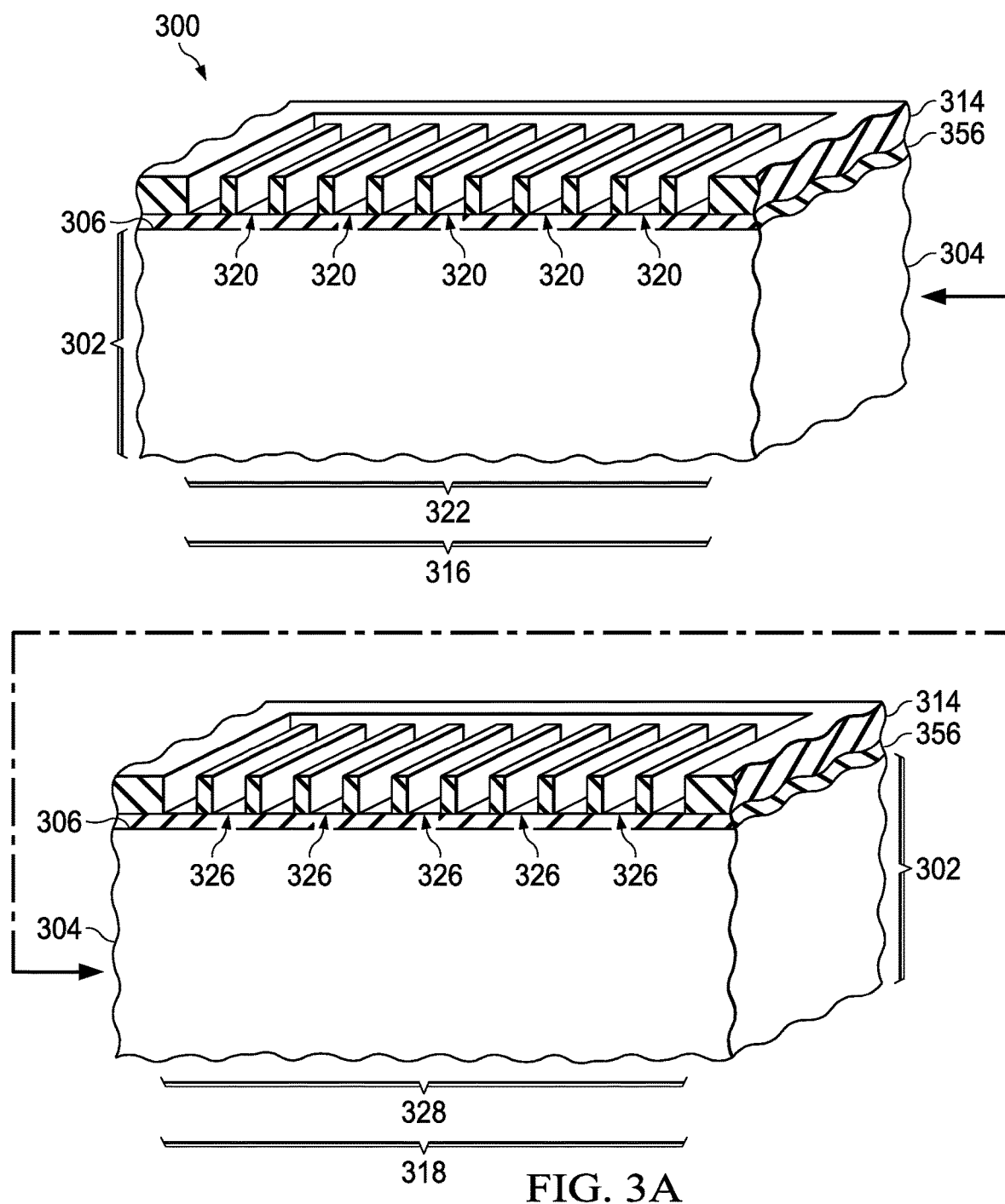
FIG. 3A through FIG. 3H are cross sections of a further example microelectronic device, depicted in stages of a further example method of formation.

FIG. 3A through FIG. 3H are cross sections of a further example microelectronic device, depicted in stages of a further example method of formation. Referring to FIG. 3A, the microelectronic device 300 is formed in and on a substrate 302. The substrate 302 includes a semiconductor material 304. The semiconductor material 304 may be implemented as disclosed in reference to FIG. 1A. The substrate 302 may be implemented as a wafer, such as a semiconductor wafer. The semiconductor material 304 extends to a top surface 306 of the substrate 302. The microelectronic device 300 may be implemented as any of the examples disclosed in reference to FIG. 1A. A protective dielectric layer 356 may be formed over the top surface 306 of the substrate 302. The protective dielectric layer 356 may include, by way of example, thermal oxide, formed by thermal oxidation of the semiconductor material 304. Alternatively, the protective dielectric layer 356 may include one or more sublayers of silicon dioxide, silicon nitride or silicon oxynitride, formed by one or more thermal CVD or PECVD processes.

An etch mask 314 is formed over the top surface 306 of the substrate 302, and over the protective dielectric layer 356. The etch mask 314 exposes the protective dielectric layer 356 in an area for a first deep trench test structure 316 and a second deep trench test structure 318. The etch mask 314 may include one or more hard mask materials, and may optionally include photoresist. In this example, the etch mask 314 may expose the protective dielectric layer 356 in areas for first pad trench segments 320 of the first deep trench test structure 316 which extend across a first probe pad region 322. The first probe pad region 322 extends at least 20 microns in every lateral direction. The areas for the first pad trench segments 320 may be continuous in the area exposed by the etch mask 314, as depicted in FIG. 3A. By way of example, each area for the first pad trench segments 320 may have a width of 2 microns to 5 microns. Similarly, the etch mask 314 may also expose the protective dielectric layer 356 in areas for second pad trench segments 326 of the second deep trench test structure 318 which extend across a second probe pad region 328. The second probe pad region 328 extends at least 20 microns in every lateral direction. The areas for the second pad trench segments 326 may be continuous in the area exposed by the etch mask 314, as depicted in FIG. 3A. Each area for the second pad trench segments 326 may have a width that is equal to the width of each area for the first pad trench segments 320.

Figure 3B:
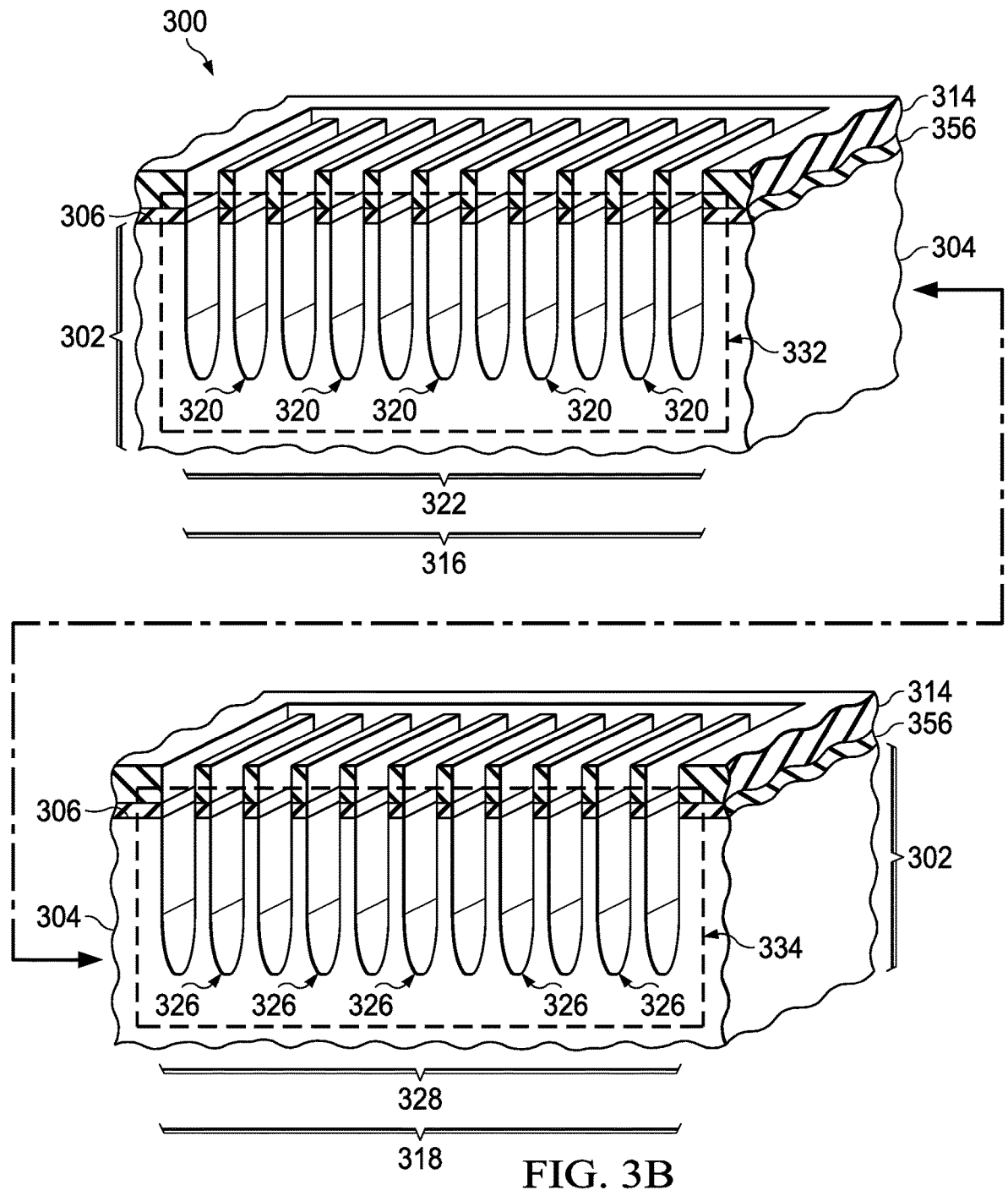

Referring to FIG. 3B, the protective dielectric layer 356 and the semiconductor material 304 are removed where exposed by the etch mask 314 to form a first continuous deep trench 332 in the substrate 302, and to form a second continuous deep trench 334 in the substrate 302. The first continuous deep trench 332 is part of the first deep trench test structure 316, and the second continuous deep trench 334 is part of the second deep trench test structure 318. The first pad trench segments 320 are connected by being parts of the first continuous deep trench 332. Similarly, the second pad trench segments 326 are connected by being parts of the second continuous deep trench 334. The first continuous deep trench 332 and the second continuous deep trench 334 may extend to depths of 3 microns to 30 microns, for example.

Figure 3C:
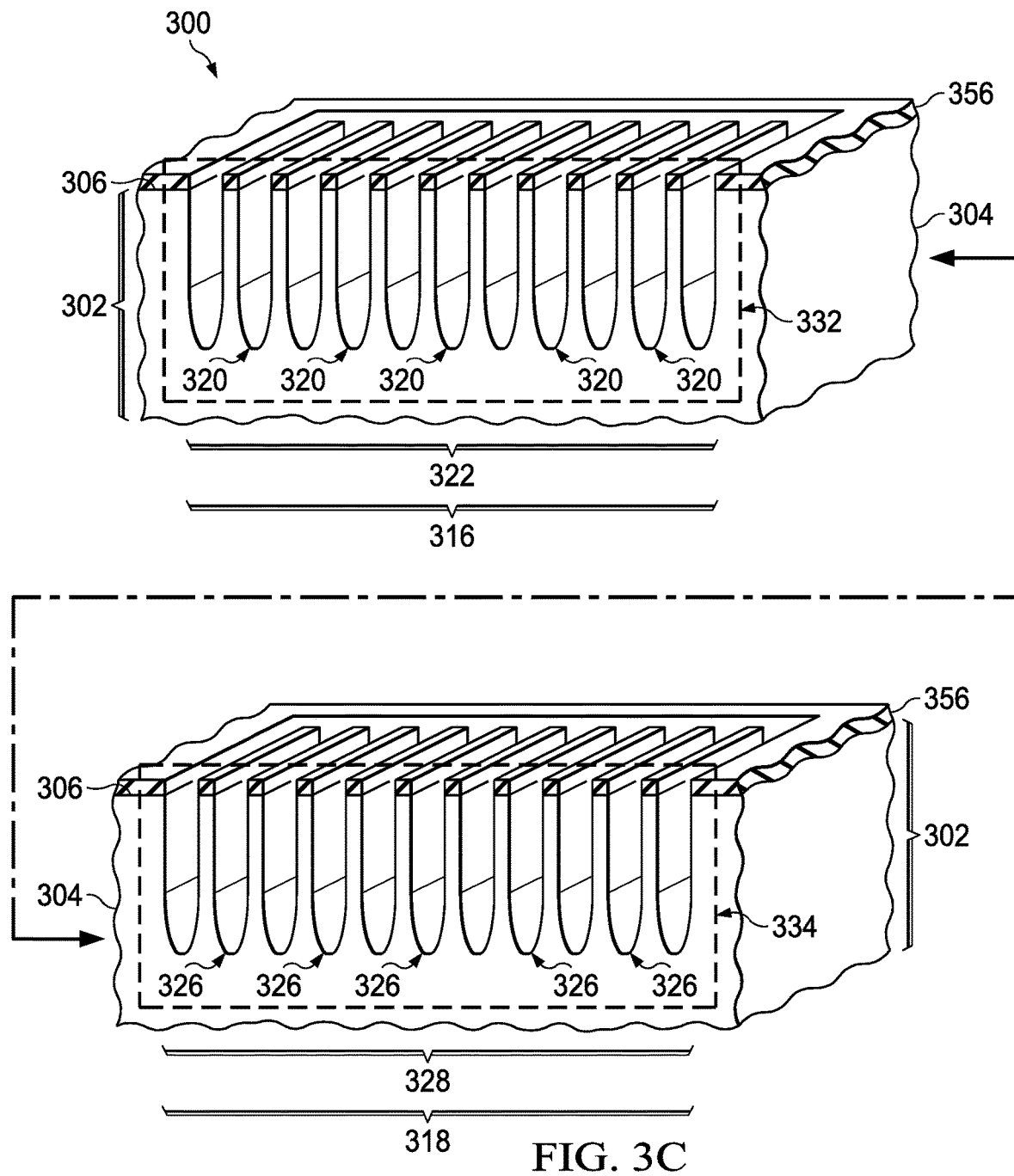

Referring to FIG. 3C, the etch mask 314 of FIG. 3B is removed after the first continuous deep trench 332 and the second continuous deep trench 334 are formed. Silicon dioxide, silicon nitride, and silicon oxynitride in the etch mask 314 may be removed as disclosed in reference to FIG. 2B. Photoresist in the etch mask 314 may be removed by a plasma process using oxygen radicals, or by a wet etch using an aqueous mixture of sulfuric acid and hydrogen peroxide. Other methods for removing the etch mask 314 are within the scope of this example.

Figure 3D:
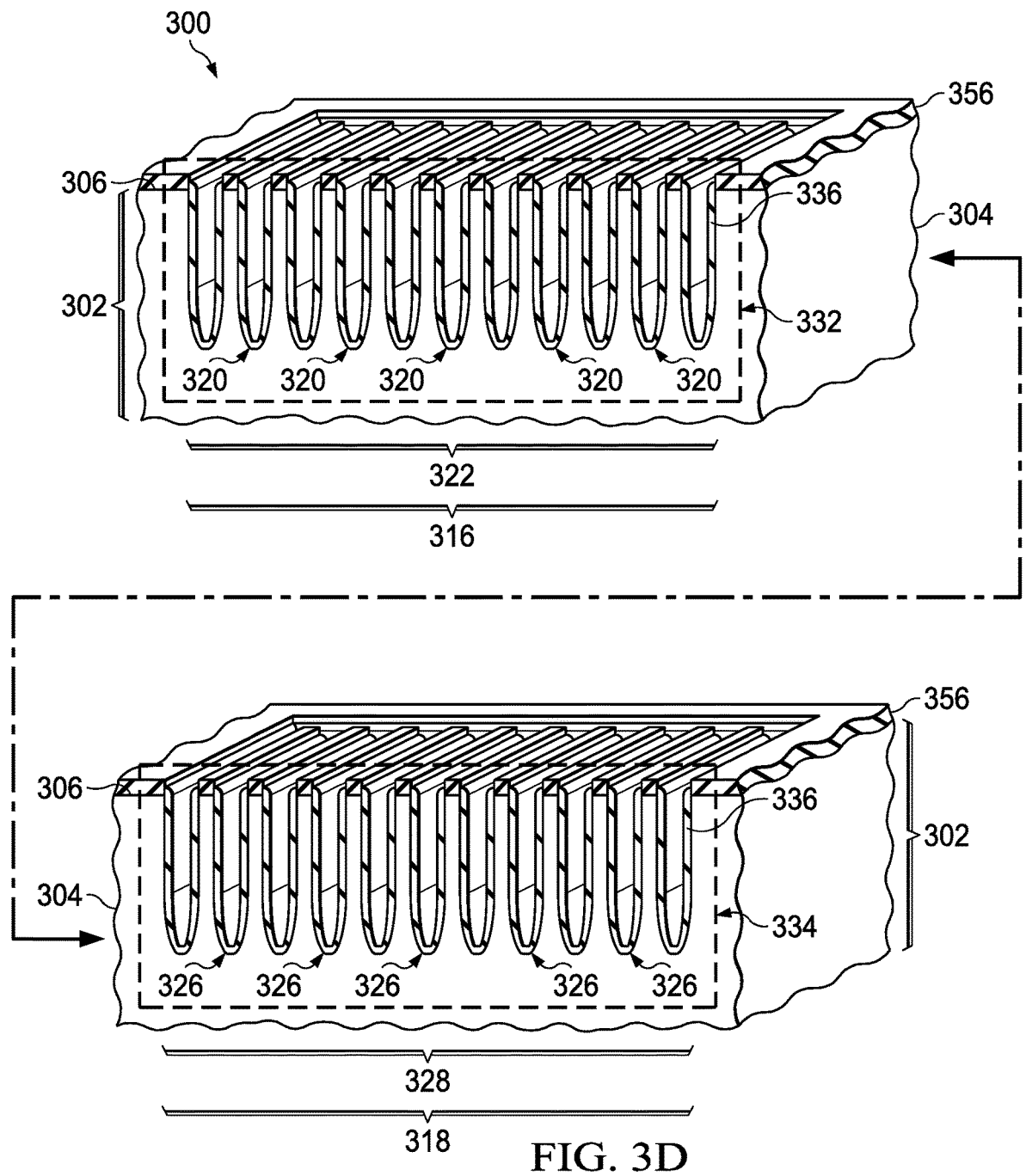

Referring to FIG. 3D, a liner 336 is concurrently formed on sidewalls of the first continuous deep trench 332 and the second continuous deep trench 334. The liner 336 may include a thermal oxide formed by thermal oxidation of the semiconductor material 304 or may include a dielectric material such as silicon dioxide, silicon nitride, silicon oxynitride, or aluminum oxide, as disclosed in reference to FIG. 2C. Other materials for the liner 336 are within the scope of this example. The liner 336 does not fill the first continuous deep trench 332 or the second continuous deep trench 334. The liner 336 may optionally be formed over the protective dielectric layer 356.

Figure 3E:
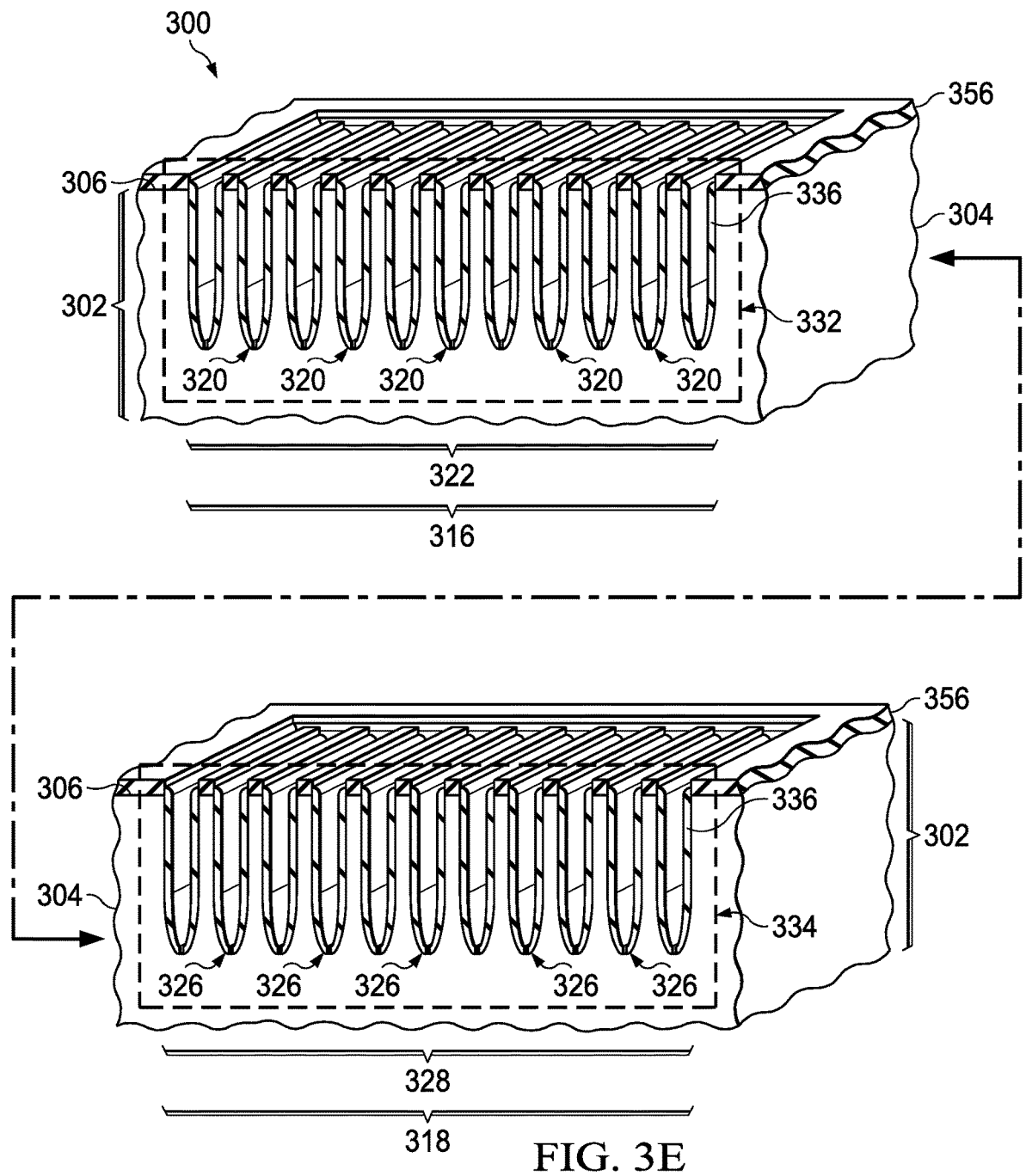

Referring to FIG. 3E, the liner 336 is removed from bottoms of the pad trench segments 320 and 326, so that the semiconductor material 304 is exposed at the bottoms of the pad trench segments 320 and 326. In this example, the liner 336 may optionally be removed along bottoms of the entire first continuous deep trench 332 and the entire second continuous deep trench 334. The liner 336 may be removed from bottoms of the pad trench segments 320 and 326 by an RIE process, as disclosed in reference to FIG. 1D. At least a portion of the liner 336 is left in place on the sidewalls of the pad trench segments 320 and 326.

Figure 3F:
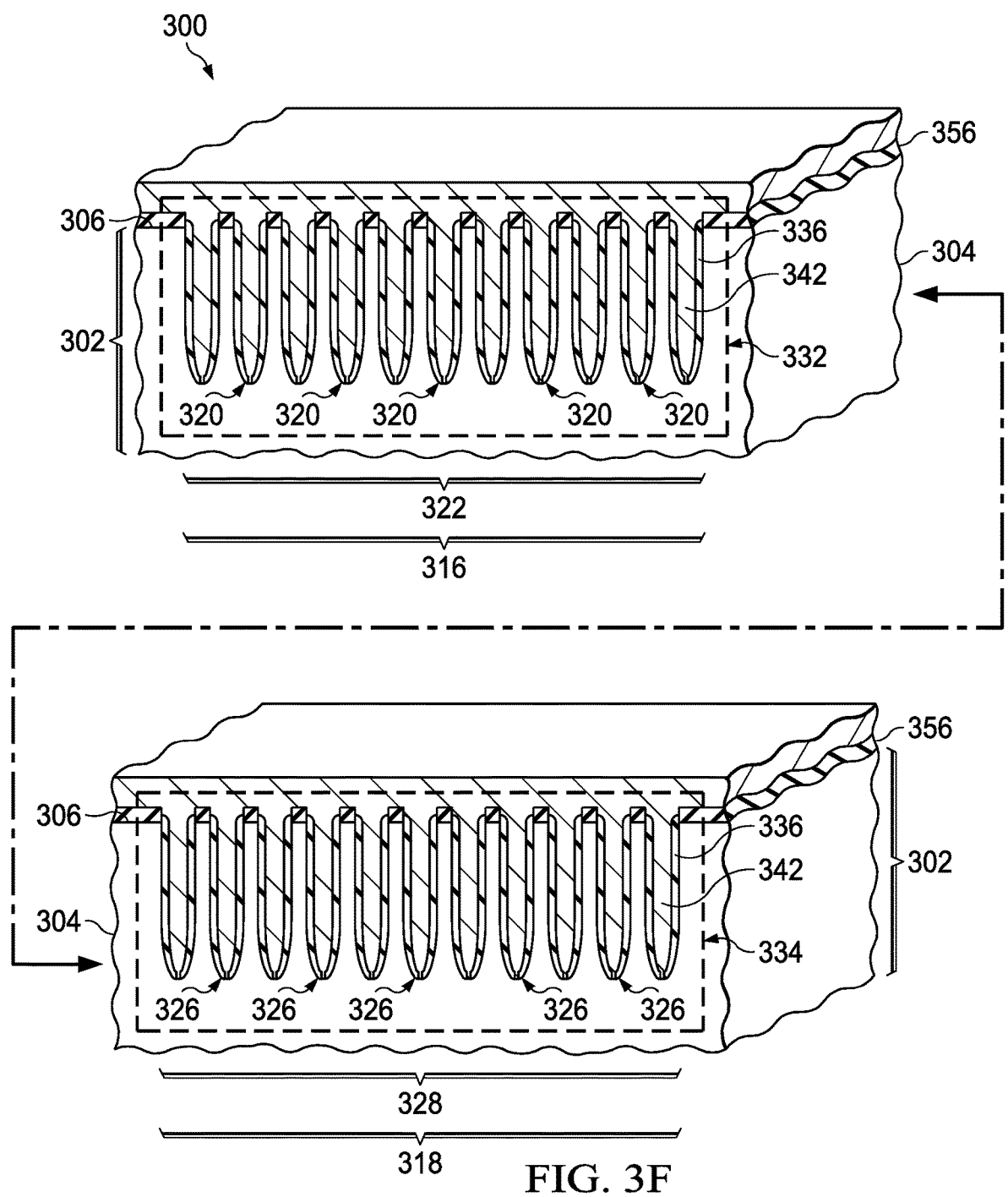

Referring to FIG. 3F, a trench fill material 342 is formed in the first continuous deep trench 332 and the second continuous deep trench 334, contacting the liner 336 and contacting the semiconductor material 304 at the bottoms of the pad trench segments 320 and 326. The trench fill material 342 is electrically conductive. The trench fill material 342 extends continuously through the first continuous deep trench 332, so that the trench fill material 342 in each of the first pad trench segments 320 is continuous with the trench fill material 342 in the other first pad trench segments 320. Similarly, the trench fill material 342 extends continuously through the second continuous deep trench 334, so that the trench fill material 342 in each of the second pad trench segments 326 is continuous with the trench fill material 342 in the other second pad trench segments 326. The trench fill material 342 may include polysilicon, or tungsten, as disclosed in reference to FIG. 1E. Other trench fill materials are within the scope of this example. The trench fill material 342 may extend over the top surface 306 of the substrate 302, and over the protective dielectric layer 356.

Figure 3G:
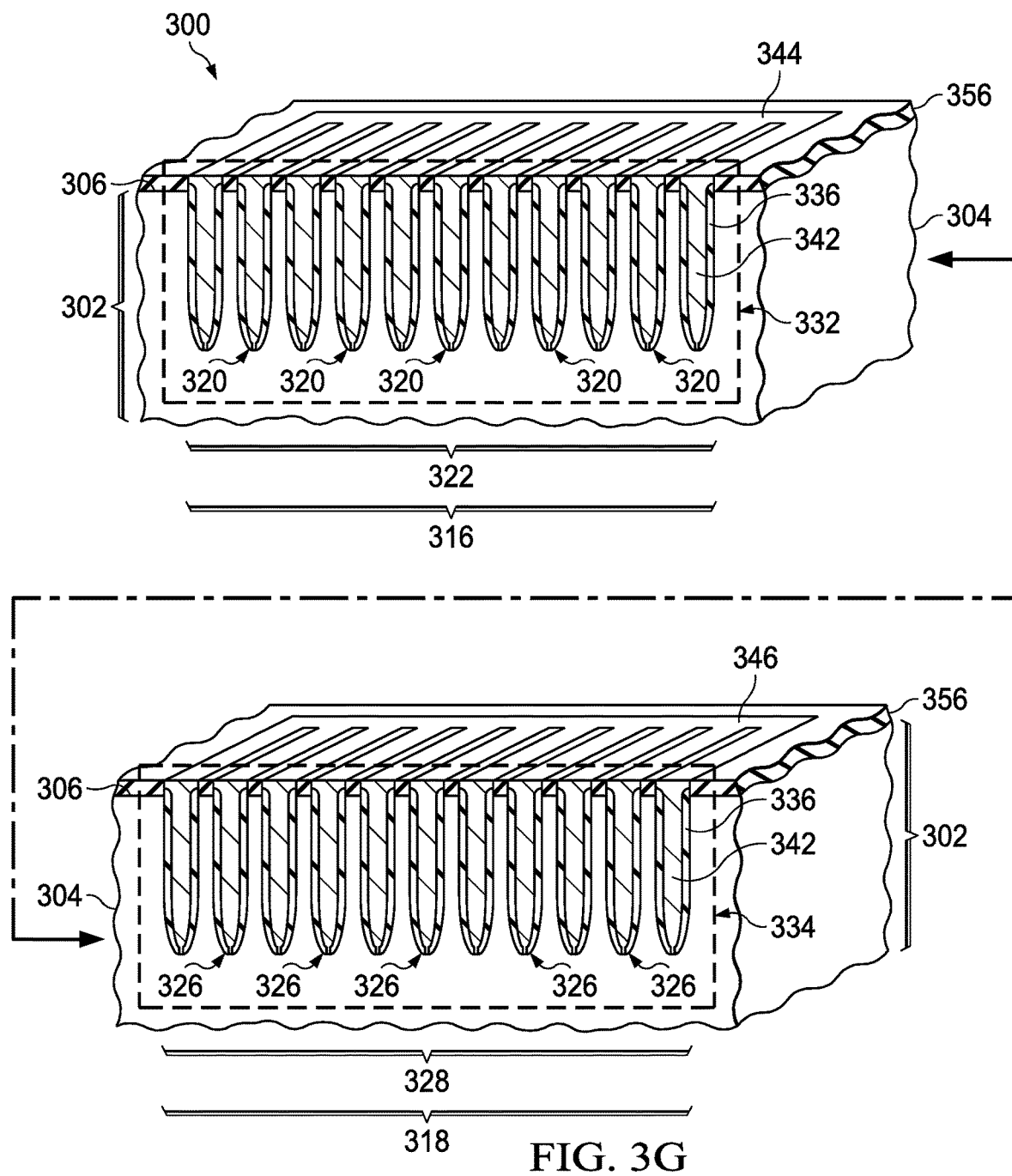

Referring to FIG. 3G, the trench fill material 342 is removed from over the protective dielectric layer 356, leaving the trench fill material 342 in the first continuous deep trench 332 and the second continuous deep trench 334. The trench fill material 342 may be removed from over the protective dielectric layer 356 by an etchback process or a CMP process, by way of example. After the trench fill material 342 is removed from over the protective dielectric layer 356, the trench fill material 342 extends to a first probe surface 344 at tops of the first pad trench segments 320 and extends to a second probe surface 346 at tops of the second pad trench segments 326. The first probe surface 344 of the first pad trench segments 320 is located proximate to, and parallel to, the top surface 306 of the substrate 302, and similarly for the second probe surface 346 of the second pad trench segments 326. The trench fill material 342 at the first probe surface 344 of the first pad trench segments 320 occupies at least 25 percent of the first probe pad region 322. Similarly, the trench fill material 342 at the second probe surface 346 of the second pad trench segments 326 occupies at least 25 percent of the second probe pad region 328. In this example, the trench fill material 342 in the first pad trench segments 320 contacts the semiconductor material 304 at the bottoms of the first pad trench segments 320, and the trench fill material 342 in the second pad trench segments 326 contacts the semiconductor material 304 at the bottoms of the second pad trench segments 326.

Figure 3H:
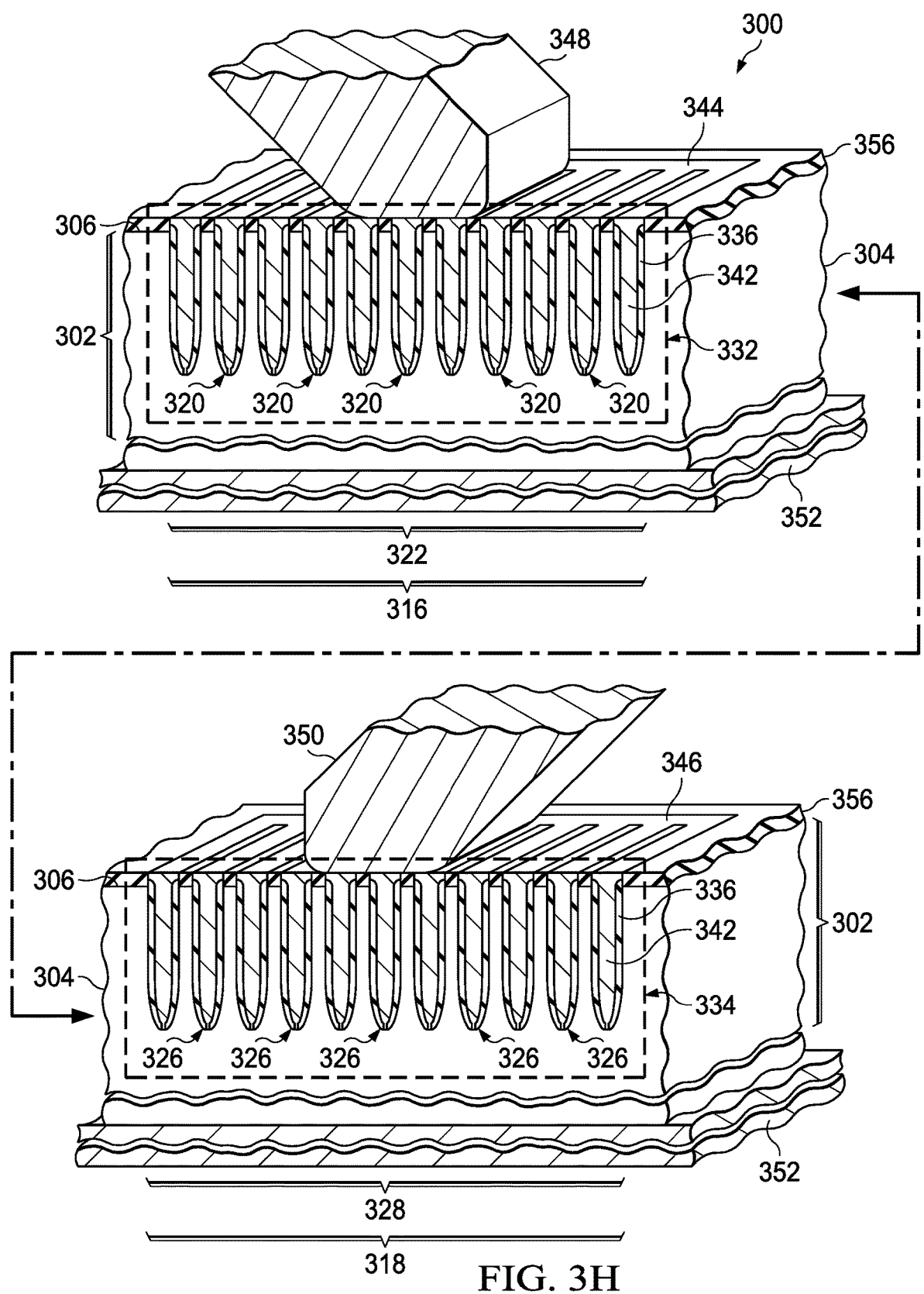

Referring to FIG. 3H, a first probe 348 is disposed on the trench fill material 342 in the first probe pad region 322, making an electrical contact with the trench fill material 342 in the pad trench segments 320. A second probe 350 is disposed on the trench fill material 342 in the second probe pad region 328, making an electrical contact with the trench fill material 342 in the second pad trench segments 326. A third probe 352 may optionally be disposed on the substrate 302, making an electrical contact to the semiconductor material 304. The third probe 352 may be implemented as a wafer chuck 352 contacting a back surface of the substrate 302, or may be implemented as a front side probe making contact with the substrate 302 at the top surface 306.

In this example, a value of an electrical impedance between the trench fill material 342 and the semiconductor material 304 below a target value may be desired for proper operation and reliability of the microelectronic device. A first estimate of the electrical impedance between the trench fill material 342 and the semiconductor material 304 of the substrate 302 may be made using a measured impedance from the first probe 348 to the second probe 350. The first estimate of the electrical impedance between the trench fill material 342 and the semiconductor material 304 of the substrate 302 may be obtained from the measured impedance by accounting for impedances of the electrical contact between the first probe 348 and the trench fill material 342 in the first deep trench test structure 316, the trench fill material 342 in the first pad trench segments 320, the semiconductor material 304 between the first pad trench segments 320 and the second pad trench segments 326, the trench fill material 342 in the second pad trench segments 326, and the electrical contact between the trench fill material 342 in the second deep trench test structure 318 and the second probe 350. A second estimate of the electrical impedance between the trench fill material 342 and the semiconductor material 304 of the substrate 302 may be made using a measured impedance from the first probe 348 to the third probe 352. In some versions of this example, in which the third probe 352 is used, the microelectronic device 300 may include only the first deep trench test structure 316.

Having the trench fill material 342 at the first probe surface 344 of the first pad trench segments 320 occupy at least 25 percent of the first probe pad region 322, and similarly for the second pad trench segments 326 may accrue the advantages disclosed in reference to FIG. 1G. Having an accurate estimate for the electrical impedance between the trench fill material 342 and the semiconductor material 304 after forming the deep trench test structures 316 and 318, and before executing additional fabrication steps such as formation of transistors and interconnects, may reduce a cost of operating a fabrication facility making the microelectronic device 300, as disclosed in reference to FIG. 1G. The first deep trench test structure 316 and the second deep trench test structure 318 of this example may be particularly advantageous for versions of the microelectronic device 300 in which only trench segments that are open at the bottoms are formed as parts of components in the microelectronic device 300. The first deep trench test structure 316 and the second deep trench test structure 318 can be formed concurrently with the trench segments to provide a capability to assess the electrical impedance between the trench fill material 342 and the semiconductor material 304 of the substrate 302.

Figure 4:
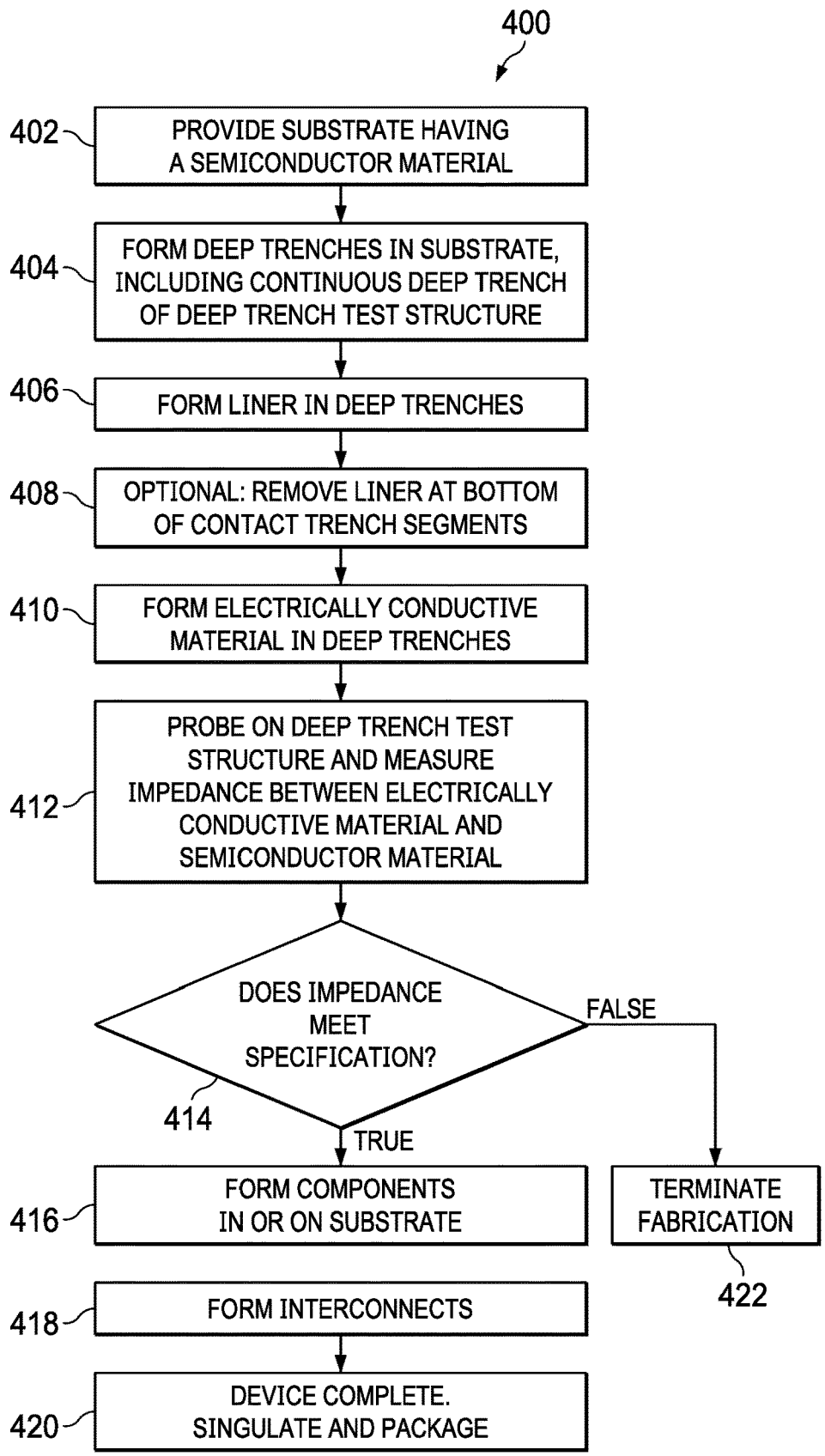
FIG. 4 is a flowchart of an example method of forming a microelectronic device containing a deep trench and a deep trench test structure.

FIG. 4 is a flowchart of an example method of forming a microelectronic device containing a deep trench and a deep trench test structure. The method 400 begins with step 402, providing a substrate having a semiconductor material. The substrate and the semiconductor material may be implemented as any of the examples disclosed in reference to FIG. 1A. The substrate may include a plurality of microelectronic devices.

The method 400 continues with step 404, forming deep trenches in the substrate, including a continuous deep trench of the deep trench test structure. The continuous deep trench includes pad trench segments which extend across a probe pad region which extends at least 20 microns in every lateral direction. The deep trenches, including the continuous deep trench, are formed concurrently. The deep trenches may be formed by any of the example methods disclosed herein. The deep trenches may include additional continuous deep trenches for additional deep trench test structures. Other methods of forming the deep trenches are within the scope of this disclosure. The deep trenches may be parts of electrical isolation structures for components of the microelectronic device.

Step 406 is forming a liner in the deep trenches, including the continuous deep trench of the deep trench test structure. The liner is electrically non-conductive, and may include one or more sublayers of dielectric material. The liner may be formed according to any of the example methods disclosed herein. Other methods of forming the liner are within the scope of this disclosure.

Optional step 408 is removing the liner at bottoms of contact trench segments of the deep trenches. The deep trenches may include the contact trench segments to provide electrical contacts to the semiconductor material of the substrate. The deep trench test structure may include a contact trench segment to provide a capability to test a direct electrical contact to the semiconductor material. The liner may be removed at the bottoms of the contact trench segments according to any of the example methods disclosed herein. Other methods of removing the liner are within the scope of this disclosure.

The method 400 continues with step 410, forming a trench fill material in the deep trenches, including the continuous deep trench of the deep trench test structure. The trench fill material is electrically conductive. The trench fill material extends to tops of the deep trenches. The trench fill material at the tops of the pad trench segments occupies at least 25 percent of the probe pad region. For instances of the deep trenches which include contact trench segments, the trench fill material extends to the semiconductor material at the bottoms of the contact trench segments. The trench fill material may be formed according to any of the example methods disclosed herein. Other methods of forming the trench fill material are within the scope of this disclosure.

After the trench fill material is formed in the deep trenches, the method 400 continues with step 412, probing on the probe pad region of the deep trench test structure and measuring an impedance between the trench fill material and the semiconductor material.

After the impedance is measured, step 414 is comparing the impedance between the trench fill material and the semiconductor material to a specification for the impedance. The specification may be written in terms of the measured impedance, or in terms of an estimated impedance that is obtained from the measured impedance.

If the impedance meets the specification in step 414, the method 400 continues with step 416, forming components of the microelectronic device in or on the substrate. The components may include transistors, by way of example. Forming other components is within the scope of this disclosure.

Following step 416, the method 400 continues with step 418, forming interconnects of the microelectronic device on the substrate. The interconnects make electrical connections to the components completing the device followed by singulation of the wafer and packaging of the dies. In step 420 is device is complete and the wafer is then singulated and the individual dies packaged.

If the impedance does not meet the specification in step 414, the method 400 continues with step 422, terminating fabrication of the microelectronic device. This may be implemented, for example, by discarding or recycling the substrate. By determining if the impedance meets the specification in step 414 before forming the components and interconnects in steps 416 and 418, and by terminating fabrication for microelectronic devices of which the impedances do not meet the specification, an operational cost of the fabrication facility producing the microelectronic device may be reduced, advantageously resulting in a reduced average cost of devices produced by the fabrication facility.

Figure 5:
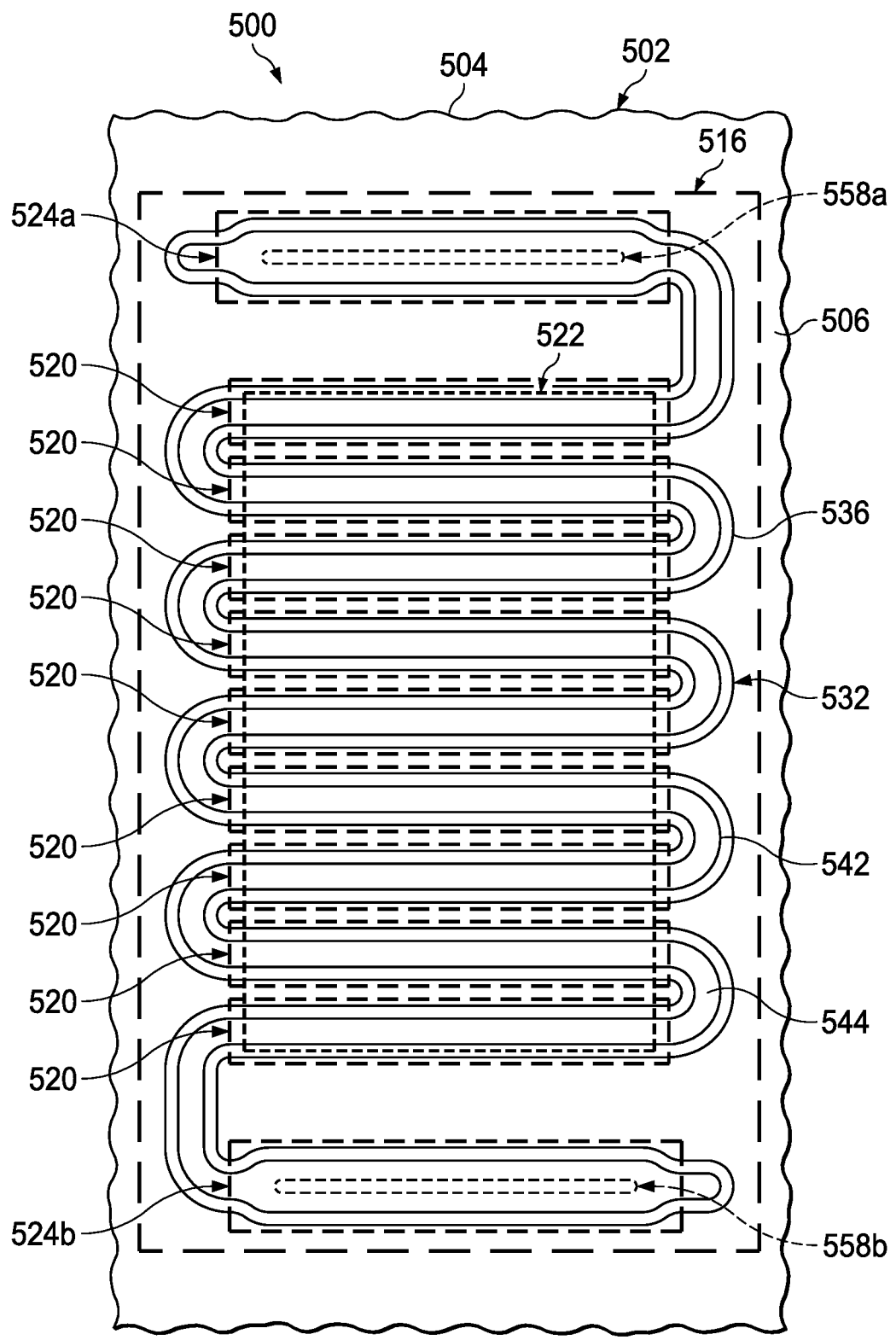
FIG. 5 is a top view of another example microelectronic device formed in and on a substrate containing a deep trench test structure.

FIG. 5 is a top view of another example microelectronic device formed in and on a substrate containing a deep trench test structure. The structure is continuous with no intersection which could lead to pattern, fill or etch marginalities. The microelectronic device 500 includes the substrate 502 with a semiconductor material 504 extending to a top surface 506 of the substrate 502. The substrate 502 includes a deep trench test structure 516. The deep trench test structure 516 includes a continuous deep trench 532 in the substrate 502; in this example, the continuous deep trench 532 may have a serpentine configuration, as depicted in FIG. 5. The deep trench test structure 516 includes a liner 536 on sidewalls of the continuous deep trench 532, and a trench fill material 542 on the liner 536 in the continuous deep trench 532. The trench fill material 542 is electrically conductive. The continuous deep trench 532 includes pad trench segments 520 of the deep trench test structure 516. The pad trench segments 520 may be parallel to each other, as depicted in FIG. 5. The pad trench segments 520 extend across a probe pad region 522; the probe pad region 522 extends at least 20 microns in every lateral direction. The trench fill material 542 extends to a probe surface 544 at tops of the pad trench segments 520. The trench fill material 542 at the probe surface 544 occupies at least 25 percent of the probe pad region 522.

The deep trench test structure 516 of this example includes a first contact trench segment 524a at a first end of the probe pad region 522, and a second contact trench segment 524b at a second end of the probe pad region 522, opposite from the first end. The first contact trench segment 524a and the second contact trench segment 524b may each be wider than each of the pad trench segments 520. The liner 536 is not present at a first bottom 558a of the first contact trench segment 524a, and the trench fill material 542 contacts the semiconductor material 504 at the first bottom 558a of the first contact trench segment 524a. Similarly, the liner 536 is not present at a second bottom 558b of the second contact trench segment 524b, and the trench fill material 542 contacts the semiconductor material 504 at the second bottom 558b of the second contact trench segment 524b. The trench fill material 542 is continuous in the deep trench test structure 516, so that the trench fill material 542 in the first contact trench segment 524a is continuous with the trench fill material 542 in the pad trench segments 520, and the trench fill material 542 in the second contact trench segment 524b is continuous with the trench fill material 542 in the pad trench segments 520.

The deep trench test structure 516 may be used to estimate an electrical impedance between the trench fill material 542 and the semiconductor material 504, as disclosed in reference to FIG. 1H. Having the deep trench test structure 516 with two contact trench segments 524a and 524b may improve an accuracy of the estimated electrical impedance.

Figure 6:
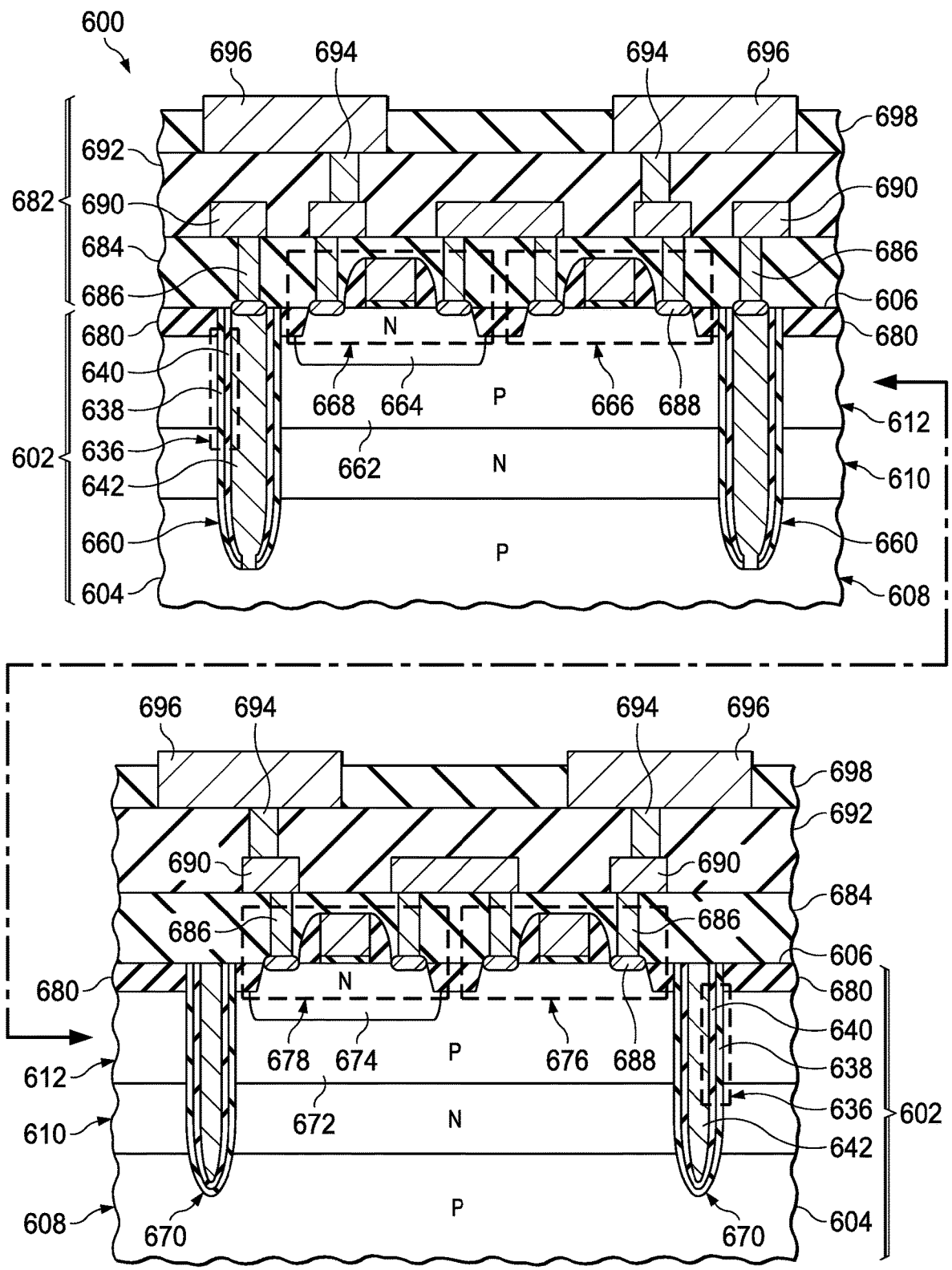
FIG. 6 is a cross section view of an example microelectronic device having deep trenches.

FIG. 6 is a cross section view of an example microelectronic device having deep trenches. The microelectronic device 600 includes a substrate 602 with a semiconductor material 604, which extends to a top surface 606 of the substrate 602. The semiconductor material 604 may include a p-type base layer 608, an n-type buried layer 610 on the base layer 608, and a p-type top layer 612 on the buried layer 610, extending to the top surface 606. The top layer 612 may have a thickness of 3 microns to 10 microns, by way of example. The buried layer 610 may have a thickness of 1 micron to 5 microns, by way of example.

The microelectronic device 600 of this example includes a first deep trench 660 in the substrate 602 which extends from the top surface 606, through the buried layer 610, to the base layer 608. The first deep trench 660 isolates a first isolated region 662 of the top layer 612 from a remainder of the top layer 612. The first isolated region 662 includes a first n-type well 664. The microelectronic device 600 includes a first isolated component 666 extending into the first isolated region 662; the first isolated component 666 may be manifested as first isolated n-channel metal oxide semiconductor (NMOS) transistor 666, as depicted in FIG. 6. The microelectronic device 600 includes a second isolated component 668 extending into the first isolated region 662; the second isolated component 668 may be manifested as first isolated p-channel metal oxide semiconductor (PMOS) transistor 668 extending into the first n-type well 664, as depicted in FIG. 6. Other types of components for the first isolated component 666 and the second isolated component 668, such as bipolar transistors, are within the scope of this example. The microelectronic device 600 may optionally include field oxide 680 at the top surface 606 of the substrate 602, laterally separating the first isolated component 666 from the second isolated component 668.

The microelectronic device 600 of this example further includes a second deep trench 670 in the substrate 602 which extends from the top surface 606, to the buried layer 610, and may optionally extend to the base layer 608. The second deep trench 670 isolates a second isolated region 672 of the top layer 612 from a remainder of the top layer 612. The second isolated region 672 includes a second n-type well 674. The microelectronic device 600 includes a third isolated component 676 extending into the second isolated region 672; the third isolated component 676 may be manifested as second isolated NMOS transistor 676, as depicted in FIG. 6. The microelectronic device 600 includes a fourth isolated component 678 extending into the second isolated region 672; the fourth isolated component 678 may be manifested as second isolated PMOS transistor 678 extending into the second n-type well 674, as depicted in FIG. 6. Other types of components for the third isolated component 676 and the fourth isolated component 678 are within the scope of this example. The field oxide 680, if present, may laterally separate the third isolated component 676 from the fourth isolated component 678.

The first deep trench 660 and the second deep trench 670 include a liner 636 on sidewalls of the first deep trench 660 and the second deep trench 670. The liner 636 may include a thermal oxide sublayer 638 contacting the semiconductor material 604, and a deposited oxide sublayer 640 on the thermal oxide sublayer 638. The first deep trench 660 and the second deep trench 670 further include a trench fill material 642 on the liner 636 in the first deep trench 660 and the second deep trench 670. The trench fill material 642 is electrically conductive. The trench fill material 642 extends proximate to the top surface 606 of the substrate 602. The liner 636 is not present at a bottom 658 of the first deep trench 660, and the trench fill material 642 contacts the semiconductor material 604 at the bottom 658 of the first deep trench 660. The trench fill material 642 in the first deep trench 660 may thus provide an electrical connection to the base layer 608 from the top surface 606 of the substrate 602.

The microelectronic device 600 further includes an interconnect region 682 over the substrate 602 and over the components 666, 668, 676, and 678. The interconnect region 682 includes a pre-metal dielectric (PMD) layer 684 on the top surface 606 of the substrate 602. The PMD layer 684 covers the components 666, 668, 676, and 678, the first deep trench 660, and the second deep trench 670. The interconnect region 682 includes contacts 686 extending through the PMD layer 684; the contacts 686 make electrical connections to the components 666, 668, 676, and 678, and the trench fill material 642 in the first deep trench 660, optionally through metal silicide 688. The contacts may include tungsten on a conductive liner, for example. The interconnect region 682 further includes interconnects 690 on the contacts 686. The interconnects 690 may include aluminum, formed by an etch process, or copper, formed by a damascene process, for example. An interlevel dielectric (ILD) layer 692 of the interconnect region 682 covers the interconnects 690. Vias 694 of the interconnect region 682 extend through the ILD layer 692 to the interconnects 690. The vias 694 may include tungsten on a conductive liner, or copper on a barrier liner, for example. The interconnect region 682 further includes bond pads 696 on the vias 694. The bond pads 696 are electrically coupled to the components 666, 668, 676, and 678 through the vias 694, the interconnects 690, the contacts 686, and the metal silicide 688. A protective overcoat (PO) layer 698 may cover the ILD layer 692 with openings for the bond pads 696. Other manifestations of the microelectronic device may include additional layers of interconnects, vias and interlevel dielectric layers.

The substrate 602 may include one or more deep trench test structures, not shown in FIG. 6, formed concurrently with the first deep trench 660 and the second deep trench 670. The deep trench tests structures may be formed according to any of the example disclosed herein. The deep trench test structures may be tested before forming the interconnect region 682, for example, as disclosed in reference to FIG. 1G and FIG. 1H, FIG. 2G and FIG. 2H, or FIG. 3H, accruing the advantages disclosed for the fabrication facility that forms the microelectronic device 600.

Figure 7:
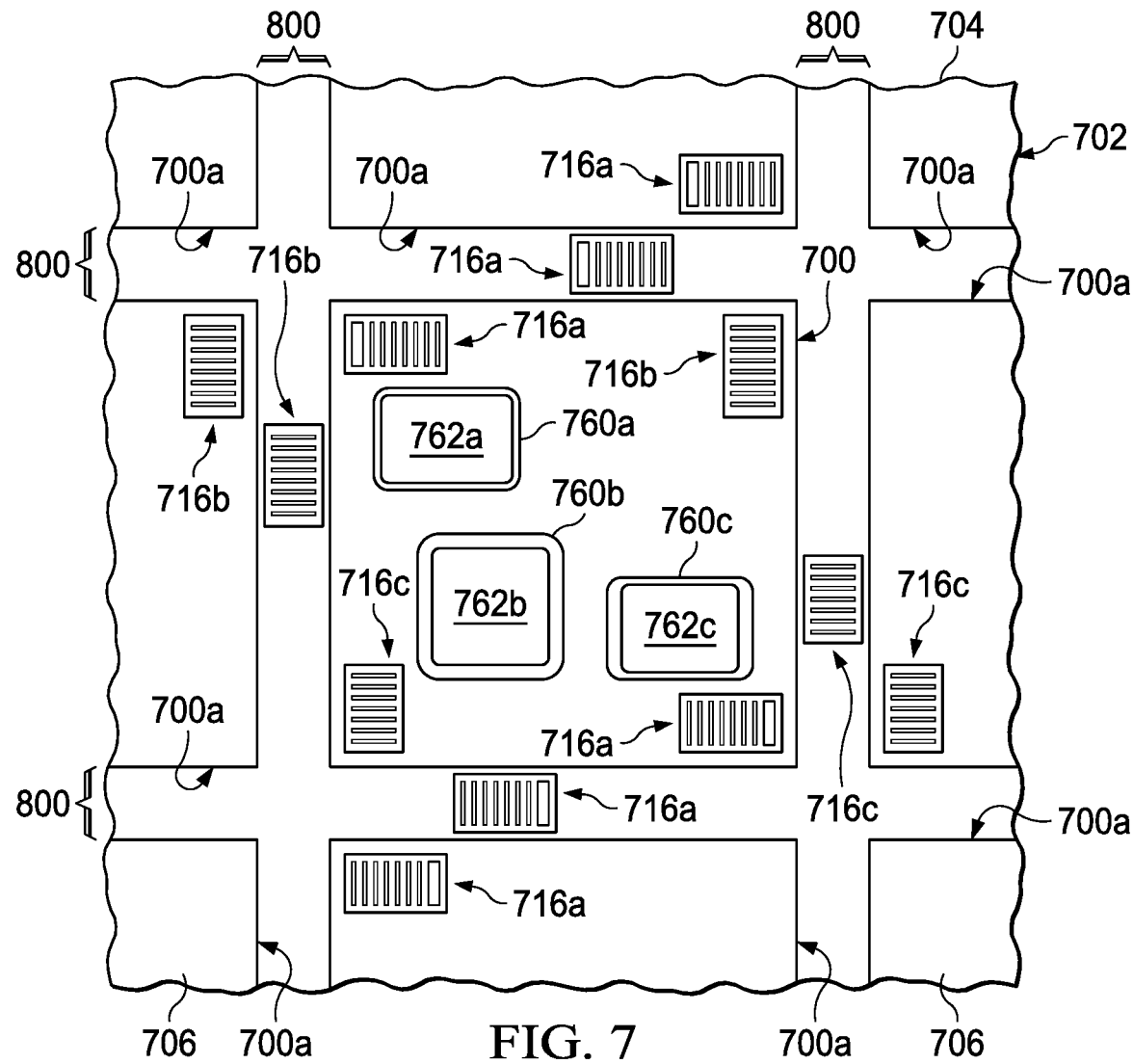
FIG. 7 is a top view of an example microelectronic device formed on a substrate having deep trench isolation structures and deep trench test structures.

FIG. 7 is a top view of an example microelectronic device formed on a substrate having deep trench isolation structures and deep trench test structures. The microelectronic device 700 includes a substrate 702 with a semiconductor material 704 extending to a top surface 706 of the substrate 702. The substrate 702 may include additional microelectronic devices 700a. The microelectronic device 700 and the additional microelectronic devices 700a may be separated by singulation lanes 800, sometimes referred to as scribe lanes or saw streets.

The microelectronic device 700 includes a first deep trench 760a which laterally isolates a first isolated region 762a of the semiconductor material 704. The microelectronic device 700 may also include a second deep trench 760b which laterally isolates a second isolated region 762b of the semiconductor material 704. The microelectronic device 700 may further include a third deep trench 760c which laterally isolates a third isolated region 762c of the semiconductor material 704. The first deep trench 760a, the second deep trench 760b, and the third deep trench 760c have a liner, not shown in FIG. 7, on sidewalls of the first deep trench 760a, the second deep trench 760b, and the third deep trench 760c, as disclosed in reference to any of the examples of FIG. 1A through FIG. 1H, FIG. 2A through FIG. 2H, and FIG. 3A through FIG. 3H. The first deep trench 760a, the second deep trench 760b, and the third deep trench 760c have a trench fill material, not shown in FIG. 7, on the liner, as disclosed in reference to any of the examples of FIG. 1A through FIG. 1H, FIG. 2A through FIG. 2H, and FIG. 3A through FIG. 3H. The trench fill material is electrically conductive.

The first deep trench 760a may have a structure similar to the first deep trench 660 of FIG. 6, in which the liner is open at a bottom of the first deep trench 760a, and the trench fill material contacts the semiconductor material 704 at the bottom of the first deep trench 760a. The second deep trench 760b may have a structure similar to the second deep trench 670 of FIG. 6, in which the liner covers a bottom of the second deep trench 760b, so that the trench fill material in the second deep trench 760b is separated from the semiconductor material 704. The third deep trench 760c may have first portions with a structure similar to the first deep trench 660 of FIG. 6, in which the liner is open at a bottom of the first portions, and the trench fill material contacts the semiconductor material 704 at the bottom of the first portions of the first deep trench 760a, and may further have second portions with a structure similar to the second deep trench 670 of FIG. 6, in which the liner covers a bottom of the second portions, so that the trench fill material in the second portions is separated from the semiconductor material 704.

The substrate 702 of this example includes at least one deep trench test structure. The substrate 702 may include a first deep trench test structure 716a having a structure similar to the first deep trench test structure 116 of FIG. 1A through FIG. 1H. The microelectronic device 700 and the additional microelectronic devices 700a may be formed with instances of the first deep trench test structure 716a located in the microelectronic device 700 and the additional microelectronic devices 700a, or located in the singulation lanes 800, or both, as depicted in FIG. 7. The first deep trench test structure 716a may be tested as disclosed in reference to FIG. 1G and FIG. 1H to estimate an impedance between the trench fill material in the first deep trench 760a and the semiconductor material 704, or to estimate an impedance between the trench fill material in the first segments of the third deep trench 760c and the semiconductor material 704, or both.

The substrate 702 may include a second deep trench test structure 716b having a structure similar to the first deep trench test structure 216 of FIG. 2A through FIG. 2H. The microelectronic device 700 and the additional microelectronic devices 700a may be formed with instances of the second deep trench test structure 716b located in the microelectronic device 700 and the additional microelectronic devices 700a, or located in the singulation lanes 800, or both, as depicted in FIG. 7. The second deep trench test structure 716b may be tested as disclosed in reference to FIG. 2G and FIG. 2H to estimate an impedance between the trench fill material in the second deep trench 760b and the semiconductor material 704, or to estimate an impedance between the trench fill material in the second segments of the third deep trench 760c and the semiconductor material 704, or both.

The substrate 702 may include a third deep trench test structure 716c having a structure similar to the first deep trench test structure 316 of FIG. 3A through FIG. 3H. The microelectronic device 700 and the additional microelectronic devices 700a may be formed with instances of the third deep trench test structure 716c located in the microelectronic device 700 and the additional microelectronic devices 700a, or located in the singulation lanes 800, or both, as depicted in FIG. 7. The third deep trench test structure 716c may be tested as disclosed in reference to FIG. 3H to estimate an impedance between the trench fill material in the first deep trench 760a and the semiconductor material 704, or to estimate an impedance between the trench fill material in the first segments of the third deep trench 760c and the semiconductor material 704, or both.

Formation of the microelectronic device 700 and the additional microelectronic devices 700a is continued after testing one or more of the deep trench test structures 716a, 716b, and 716c. Formation of the microelectronic device 700 and the additional microelectronic devices 700a includes forming components in and on the substrate 702 in the microelectronic device 700 and the additional microelectronic devices 700a, and forming interconnect regions on the substrate 702 in the microelectronic device 700 and the additional microelectronic devices 700a. Subsequently, the microelectronic device 700 is singulated from the additional microelectronic devices 700a by cutting through the substrate 702 in the singulation lanes 800. One or more of the deep trench test structures 716a, 716b, and 716c may be cut through during the singulation process, so that the singulated microelectronic device 700 has only a portion of the deep trench test structures 716a, 716b, and 716c that were formed in the singulation lanes 800 adjacent to the microelectronic device 700.

Various features of the examples disclosed herein may be combined in other manifestations of example microelectronic devices. For example, any deep trench test structures may have liners with one layer of dielectric material, as described in reference to FIG. 2A through FIG. 2H, or may have liners with more than one layer of dielectric material, as described in reference to FIG. 1A through FIG. 1H, and FIG. 3A through FIG. 3H. Any microelectronic devices may have one or more deep trenches with a trench fill material that contacts a semiconductor material of the substrate at bottoms of the deep trenches, as described in reference to the first deep trench 660 of FIG. 6. Any microelectronic devices may have one or more deep trenches with a trench fill material that is isolated from a semiconductor material of the substrate, as described in reference to the second deep trench 670 of FIG. 6.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate having a top surface;
   and a semiconductor material extending to the top surface;
   a deep trench test structure in the substrate, the deep trench test structure including:
      a continuous deep trench in the semiconductor material, the continuous deep trench extending from the top surface of the substrate, the continuous deep trench including pad trench segments;
      a liner on sidewalls of the pad trench segments, the liner being electrically non-conductive; and
      a trench fill material in the continuous deep trench on the liner and extending to a top of each pad trench segment, the trench fill material being electrically conductive; wherein:
   the pad trench segments extend across a probe pad region;
   the probe pad region extends at least 20 microns in every lateral direction; and
   the trench fill material at the tops of the pad trench segments occupies at least 25 percent of the probe pad region.

2. The microelectronic device of claim 1, wherein the liner extends across a bottom of each of the pad trench segments, separating the trench fill material from the semiconductor material.

3. The microelectronic device of claim 1, wherein the deep trench test structure includes a contact trench segment of the continuous deep trench, wherein:
   the contact trench segment includes the liner on sidewalls of the contact trench segment;
   the contact trench segment includes the trench fill material on the liner, the trench fill material extending through the liner to the semiconductor material at a bottom of the contact trench segment; and
   the trench fill material in the contact trench segment is continuous with the trench fill material in the pad trench segments.

4. The microelectronic device of claim 3, wherein the contact trench segment is wider than each of the pad trench segments.

5. The microelectronic device of claim 4, wherein the contact trench segment extends further from the top surface of the substrate than each of the pad trench segments.

6. The microelectronic device of claim 1, wherein the trench fill material extends through the liner to the semiconductor material at a bottom of each of the pad trench segments.

7. The microelectronic device of claim 1, wherein:
   the deep trench test structure is a first deep trench test structure;
   the continuous deep trench is a first continuous deep trench;
   the pad trench segments are first pad trench segments;
   the probe pad region is a first probe pad region; and
   further comprising a second deep trench test structure, the second deep trench test structure including:
      a second continuous deep trench in the semiconductor material, the second continuous deep trench extending from the top surface of the substrate, the second continuous deep trench including second pad trench segments;
      the second deep trench test structure includes the liner on sidewalls of the second pad trench segments; and
      the second deep trench test structure includes the trench fill material in the second continuous deep trench on the liner and extending to a top of each second pad trench segment; wherein:

the second pad trench segments extend across a second probe pad region;

the second probe pad region extends at least 20 microns in every lateral direction; and the trench fill material at the tops of the second pad trench segments occupies at least 25 percent of the second probe pad region.

8. The microelectronic device of claim 7, wherein:

the liner extends across a bottom of each of the first pad trench segments, separating the trench fill material from the semiconductor material contacting the first pad trench segments; and the liner extends across a bottom of each of the second pad trench segments, separating the trench fill material from the semiconductor material contacting the second pad trench segments.

9. The microelectronic device of claim 8, wherein:

the first deep trench test structure includes a first contact trench segment of the first continuous deep trench, wherein:

the first contact trench segment includes the liner on sidewalls of the first contact trench segment;

the first contact trench segment includes the trench fill material on the liner, the trench fill material extending through the liner to the semiconductor material at a bottom of the first contact trench segment; and the trench fill material in the first contact trench segment is continuous with the trench fill material in the first pad trench segments; and the second deep trench test structure includes a second contact trench segment of the second continuous deep trench, wherein:

the second contact trench segment includes the liner on sidewalls of the second contact trench segment;

the second contact trench segment includes the trench fill material on the liner, the trench fill material extending through the liner to the semiconductor material at a bottom of the second contact trench segment; and the trench fill material in the second contact trench segment is continuous with the trench fill material in the second pad trench segments.

10. The microelectronic device of claim 7, wherein:

the trench fill material extends through the liner to the semiconductor material at a bottom of each of the first pad trench segments; and the trench fill material extends through the liner to the semiconductor material at a bottom of each of the second pad trench segments.

11. The microelectronic device of claim 1, wherein the deep trench test structure is located in a singulation lane.

12. A method of forming a microelectronic device, comprising:

providing a substrate having a top surface, the substrate including a semiconductor material extending to the top surface;

forming an etch mask over the substrate, the etch mask exposing a continuous area for a deep trench test structure, the area for the deep trench test structure including areas for pad trench segments, wherein the areas for the pad trench segments extend across a probe pad region, the probe pad region extending at least 20 microns in every lateral direction;

removing the semiconductor material from the substrate where exposed by the etch mask to form a continuous deep trench extending from the top surface of the substrate, the continuous deep trench including the pad trench segments;

forming a liner in the continuous deep trench contacting the semiconductor material at sidewalls of the pad trench segments, the liner being electrically non-conductive; and forming a trench fill material on the liner on the continuous deep trench, the trench fill material extending to tops of the pad trench segments, wherein the trench fill material at the tops of the pad trench segments occupies at least 25 percent of the probe pad region.

13. The method of claim 12, wherein forming the liner includes oxidizing the semiconductor material at the sidewalls of the continuous deep trench to form a thermal oxide on the sidewalls.

14. The method of claim 12, wherein forming the liner includes forming a deposited layer using a chemical vapor deposition (CVD) process.

15. The method of claim 12, wherein the liner extends across a bottom of each of the pad trench segments, separating the trench fill material from the semiconductor material contacting the pad trench segments.

16. The method of claim 12, wherein:

the continuous deep trench includes a contact trench segment;

the liner is formed on sidewalls of the contact trench segment; and further comprising removing the liner at a bottom of the contact trench segment before forming the trench fill material, the trench fill material contacting the semiconductor material at the bottom of the contact trench segment.

17. The method of claim 16, wherein the contact trench segment is wider than each of the pad trench segments.

18. The method of claim 17, wherein removing the liner at the bottom of the contact trench segment includes a reactive ion etch (RIE) process which removes a portion of the liner in the pad trench segments.

19. The method of claim 12, further comprising measuring an electrical impedance between the trench fill material in the deep trench test structure and the semiconductor material, by a method including disposing a probe on the trench fill material in the probe pad region.

20. The method of claim 12, wherein the deep trench test structure is located in a singulation lane.

* * * * *